(12) United States Patent
Jiang et al.

(10) Patent No.: US 11,215,328 B2
(45) Date of Patent: Jan. 4, 2022

(54) LED TUBE LAMP

(71) Applicant: JIAXING SUPER LIGHTING ELECTRIC APPLIANCE CO., LTD, Jiaxing (CN)

(72) Inventors: Tao Jiang, Jiaxing (CN); Ming-bin Wang, Jiaxing (CN); Jun-Ren Chen, Jiaxing (CN); Ai-Ming Xiong, Jiaxing (CN); Feng Zou, Jiaxing (CN); Wei-Hong Xu, Jiaxing (CN); Jian Lu, Jiaxing (CN); Guang-Dong Wang, Jiaxing (CN)

(73) Assignee: JIAXING SUPER LIGHTING ELECTRIC APPLIANCE CO., LTD, Jiaxing (CN)

( * ) Notice: Subject to any disclaimer, the term of this patent is extended or adjusted under 35 U.S.C. 154(b) by 0 days.

(21) Appl. No.: 17/035,615

(22) Filed: Sep. 28, 2020

(65) Prior Publication Data

US 2021/0025552 A1 Jan. 28, 2021

Related U.S. Application Data

(63) Continuation of application No. 16/731,342, filed on Dec. 31, 2019, now Pat. No. 10,823,342.

(30) Foreign Application Priority Data

Jan. 2, 2019 (CN) .......................... 201910001656.8
Feb. 28, 2019 (CN) .......................... 201910152736.3
(Continued)

(51) Int. Cl.
*F21K 9/278* (2016.01)
*H05K 1/18* (2006.01)
(Continued)

(52) U.S. Cl.
CPC ............ *F21K 9/278* (2016.08); *F21V 15/015* (2013.01); *F21V 23/02* (2013.01); *H05K 1/181* (2013.01);
(Continued)

(58) Field of Classification Search
CPC .. F21K 9/27–278; F21V 19/001–0055; H05K 2201/10106; H01R 33/74–94
See application file for complete search history.

(56) References Cited

U.S. PATENT DOCUMENTS 9,303,860 B1 ‡ 4/2016 Madireddi ............ F21V 31/005
9,510,400 B2 * 11/2016 Scapa ................... H05B 33/08
(Continued)

FOREIGN PATENT DOCUMENTS

CN   205491290 U   8/2016
JP   2014063616 A * 4/2014
(Continued)

*Primary Examiner* — Mariceli Santiago
(74) *Attorney, Agent, or Firm* — Simon Kuang Lu

(57) ABSTRACT

An LED tube lamp, comprising: a lamp tube; a first circuit board, disposed in the lamp tube, having a plurality of light sources mounted thereon; two lamp caps disposed at respective ends of the lamp tube; and a power supply substantially disposed in one or both of the two lamp caps, the power supply having a second circuit board, the second circuit board is electrically connected to the first circuit board. The lamp cap includes a body and an insulating portion, the insulating portion constitutes at least a part of an end of the lamp cap, the insulating portion has an inner side surface, and a slot is set on the inner side surface, the second circuit board is inserted into the slot for fastening.

18 Claims, 15 Drawing Sheets

(30) Foreign Application Priority Data

| | | |
|---|---|---|
| Jun. 12, 2019 | (CN) | 201910506394.0 |
| Jun. 14, 2019 | (CN) | 201910516229.3 |
| Nov. 27, 2019 | (CN) | 201911179027.0 |

(51) Int. Cl.
   *F21V 15/015* (2006.01)
   *F21V 23/02* (2006.01)
   *F21Y 115/10* (2016.01)
   *F21Y 103/10* (2016.01)

(52) U.S. Cl.
   CPC ....... *F21Y 2103/10* (2016.08); *F21Y 2115/10* (2016.08); *H05K 2201/10106* (2013.01); *H05K 2201/10522* (2013.01)

(56) References Cited

U.S. PATENT DOCUMENTS

| | | | | |
|---|---|---|---|---|
| 10,145,516 | B2 * | 12/2018 | Thiel | F21K 9/278 |
| 2008/0055894 | A1 ‡ | 3/2008 | Deng | F21K 9/27 |
| | | | | 362/217.05 |
| 2010/0124054 | A1 | 5/2010 | Chen et al. | |
| 2010/0201269 | A1 | 8/2010 | Tzou et al. | |
| 2011/0141723 | A1 ‡ | 6/2011 | Lai | F21K 9/272 |
| | | | | 362/218 |
| 2012/0008316 | A1 * | 1/2012 | Ivey | F21K 9/272 |
| | | | | 362/217.13 |
| 2012/0293991 | A1 * | 11/2012 | Lin | F21K 9/272 |
| | | | | 362/225 |
| 2013/0223053 | A1 | 8/2013 | Liu et al. | |
| 2014/0340884 | A1 | 11/2014 | Hsia et al. | |
| 2015/0292681 | A1 * | 10/2015 | Liang | F21V 19/003 |
| | | | | 362/222 |
| 2016/0091148 | A1 | 3/2016 | Leung et al. | |
| 2016/0091156 | A1 ‡ | 3/2016 | Li | F21V 23/002 |
| | | | | 362/221 |
| 2016/0215936 | A1 ‡ | 7/2016 | Jiang | F21V 29/508 |
| 2016/0348851 | A1 * | 12/2016 | Amrine, Jr. | F21V 23/06 |
| 2018/0112836 | A1 * | 4/2018 | Rieder | F21K 9/272 |
| 2019/0063690 | A1 | 2/2019 | Eckert et al. | |

FOREIGN PATENT DOCUMENTS

| | | | |
|---|---|---|---|
| JP | 2015050166 A | * | 3/2015 |
| JP | 2015065083 A | * | 4/2015 |

\* cited by examiner
‡ imported from a related application

LED TUBE LAMP

CROSS-REFERENCE TO RELATED APPLICATIONS

This application is a continuation application of U.S. application Ser. No. 16/731,342 filed on 2019 Dec. 31, which claims priority to the following Chinese Patent Applications No. CN 201910001656.8 filed on 2019 Jan. 2, CN 201910152736.3 filed on 2019 Feb. 28, CN 201910506394.0 filed on 2019 Jun. 12, CN 201910516229.3 filed on 2019 Jun. 14, CN 201911179027.0 filed on 2019 Nov. 27, the disclosures of which are incorporated herein in their entirety by reference.

TECHNICAL FIELD

The present disclosure relates to an LED lighting device, and more particularly, to an LED tube lamp.

RELATED ART

LED lighting is widely used because its benefits of far less energy consumption and longevity. The LED fluorescent lamp, commonly known as a straight tube lamp, generally includes a lamp tube, a first circuit board with a light source disposed in the lamp tube, lamp caps are respectively disposed at both ends of the lamp tube, and a power supply is disposed in the lamp caps. The light source and the power supply are electrical connected through the first circuit board. The light source is made from a plurality of LEDs arranged on the first circuit board, and the plurality of LEDs are sequentially arranged along the length of the lamp tube.

The traditional LED tube lamp includes a second circuit board (electronic components are installed on the second circuit board to form a power supply), a first circuit board and a lamp cap. The second circuit board far from the end of its matched lamp cap connects with the first circuit board. The connecting method of the second circuit board and the lamp cap of the tube lamp is generally that the second circuit board is inserted into the slot of the lamp cap in order to fasten. However, if the lamp cap is made of metal, the side wall of the lamp cap can't be provided with a slot to fix the second circuit board. If the second circuit board is not fixed accordingly, it may loosen during handling or transportation, causing the wire to break.

SUMMARY

The present disclosure is directed to a new LED tube lamp and features in various aspects to solve the above problems.

The present disclosure provides An LED tube lamp, comprising: a lamp tube; a first circuit board, disposed in the lamp tube, having a plurality of light sources mounted thereon; two lamp caps disposed at respective ends of the lamp tube; and a power supply substantially disposed in one or both of the two lamp caps, the power supply having a second circuit board, the second circuit board is electrically connected to the first circuit board; wherein the lamp cap includes a body and an insulating portion, the insulating portion constitutes at least a part of an end of the lamp cap, the insulating portion has an inner side surface, and a slot is set on the inner side surface, the second circuit board is inserted into the slot for fastening.

In some embodiments, the insulating portion includes a bottom wall, a first side wall, and a second side wall, and the bottom wall, the first side wall, and the second side wall form the slot, and the end of the bottom wall forms the bottom of the slot.

In some embodiments, the end of the bottom wall and the inner side surface maintain space.

In some embodiments, the first side wall has a first coupling surface, the second side wall has a second coupling surface, the first coupling surface and the second coupling surface collectively constitute side walls on both sides of the slot, the width or area of the first coupling surface is configured to be larger than the width or area of the second coupling surface.

In some embodiments, the first side wall has a first guide surface, while the second side wall has a second guide surface, the first guide surface and the second guide surface together form an opening of the slot to facilitate the second circuit board inserted into the slot through the opening.

In some embodiments, a limiting portion is set on an end portion of the second circuit board and the limiting portion matches the bottom wall to restrict the movement from the second circuit board in the width direction.

In some embodiments, the limiting portion includes a notch and the bottom wall is stuck in the notch.

In some embodiments, the ratio of the depth of the slot to the length of the second circuit board is at least 0.08.

In other embodiments, the size of the depth of the slot is between 2 and 5 mm.

In some embodiments, the ratio of the width of the slot to the thickness of the second circuit board is between 0.9:1 and 1.2:1.

In some embodiments, the first circuit board has a first pad, and the third circuit board has a second pad, the first circuit board and the third circuit board are directly soldered through the first pad and the second pad.

In some embodiments, a hollow conductive pin is disposed on the insulating portion, the cumulative creepage distance between the hollow conductive pin and the body of the lamp cap is at least 4.5 mm.

In some embodiments, a convex portion is set on the outer edge of the insulation portion, the body forms a groove, and the convex portion is disposed in the groove.

In some embodiments, the shortest distance between the second circuit board and the inner wall of the body in the width direction of the lamp tube is greater than 3 mm.

In some embodiments, the first circuit board is a soft circuit board or a flexible circuit board, the first circuit board has a first portion fixed on the inner surface of the lamp tube and a second portion not fixed on the inner surface of the lamp tube, the second portion of the first circuit and the second circuit board are fastened by welding.

In some embodiments, the second circuit board has a first surface and a second surface, an electronic component is installed on the first surface, the distance between the first portion of the first circuit board attached to the inner surface of the lamp tube and the second surface of the second circuit board in the width direction of the lamp tube is greater than 3.5 mm.

In some embodiments, the distance between the first portion of the first circuit board attached to the inner surface of the lamp tube and the second surface of the second circuit board in the width direction of the lamp tube is less than half the diameter of the inner surface of the lamp tube.

In some embodiments, the electronic component includes a capacitor, an electrolytic capacitor, a fuse, or a transformer.

In some embodiments, two sets of the slots are installed and the two sets of the slots are symmetrically installed on the insulating portion. In some embodiments, the melting point of the fusible portion is less than or equal to the melting point of any conductive substance on the second circuit board.

In some embodiments, the LED tube lamp is model T8 and the outer diameter of the lamp tube 1 is around 25.4 mm.

DETAILED DESCRIPTION

In order to better understanding of the present disclosure, the present disclosure will be described more fully with reference to the accompanying drawings. The drawings show a preferred embodiment of the disclosure. However, the present disclosure is implemented in many different forms and is not limited to the embodiments described below. Rather, these embodiments provide a thorough understanding of the present disclosure. The following directions such as "axial direction", "upper", "lower" and the like are for more clearly indicating the structural position relationship, and are not a limitation on the present invention. In the present invention, the "vertical", "horizontal", and "parallel" are defined as: including the case of ±10% based on the standard definition. For example, vertical usually refers to an angle of 90 degrees with respect to the reference line, but in the present invention, vertical refers to a condition including 80 degrees to 100 degrees.

Figure 1:
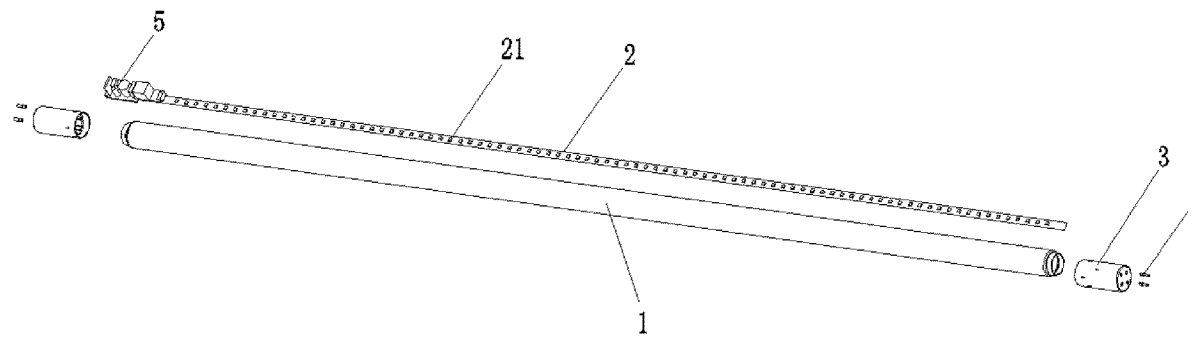
FIG. 1 illustrates a three-dimensional exploded diagram of an LED tube lamp according to an embodiment of the instant disclosure.

Please refer to FIG. 1, the instant disclosure provides an embodiment of the LED tube lamp which comprises a lamp tube 1, a first circuit board 2 disposed in the lamp tube 1 and two lamp caps 3 respectively disposed at both ends of the lamp tube 1, and a hollow conductive pins 4 for connecting an external power supply is disposed on the two lamp caps 3. The lamp tube 1 is a plastic lamp tube, a glass lamp tube, or a plastic and metal mixed lamp tube, or a glass and metal mixed lamp tube. The size of the two lamp caps 3 (the axial length dimension of the lamp cap 3) is the same or different. The instant disclosure provides an embodiment of multiple light sources 21 set on the first circuit board 2. When the light source 21 is in operation, the light source 21 forms a heat conduction path with the lamp tube 1 and the first circuit board 2. In this way, it is convenient to quickly dissipate the heat generated from the inside of the lamp tube 1 to the outside of the lamp tube 1 during the operation of the light source 21. The instant disclosure provides an embodiment of the first circuit board 2 being fixed to the inner surface of the lamp tube 1 by an adhesive, that is, the first circuit board 2 is fixed to the inner surface of the lamp tube 1 by an adhesive. The first circuit board 2 forms a heat conduction path with the lamp tube 1 through glue. In some embodiments, the first circuit board 2 is fixed to the inner surface of the lamp tube 1 with a thermally conductive adhesive to improve the thermal conductivity. A power supply 5 is disposed in the lamp caps 3, and the power supply 5 and the light source 21 are electrically connected by the first circuit board 2. At least a part of the power supply 5 in a radial projection of the LED tube lamp overlaps the lamp caps 3. The power supply 5 can be a single unit (for example, the power supply modules are all concentrated in one component and disposed in one of the lamp caps 3 (non-light-emitting area)). Alternatively, the power supply 5 is also divided into two parts, which are called dual bodies (that is, all power supply modules are respectively installed in two parts), and the two parts are respectively installed in the lamp caps 3 (non-light-emitting areas) at both ends of the lamp tube 1. In this embodiment, the power supply 5 includes a second circuit board 51 (as shown in FIG. 3) and a plurality of electronic components 52.

Figure 2:
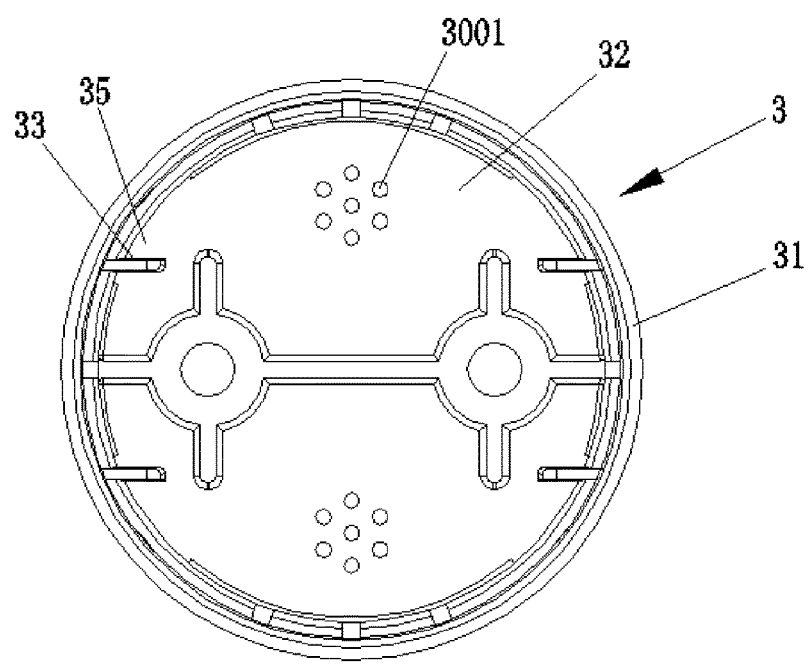
FIG. 2 illustrates a perspective diagram of a lamp cap according to an embodiment of the instant disclosure.
Figure 3:
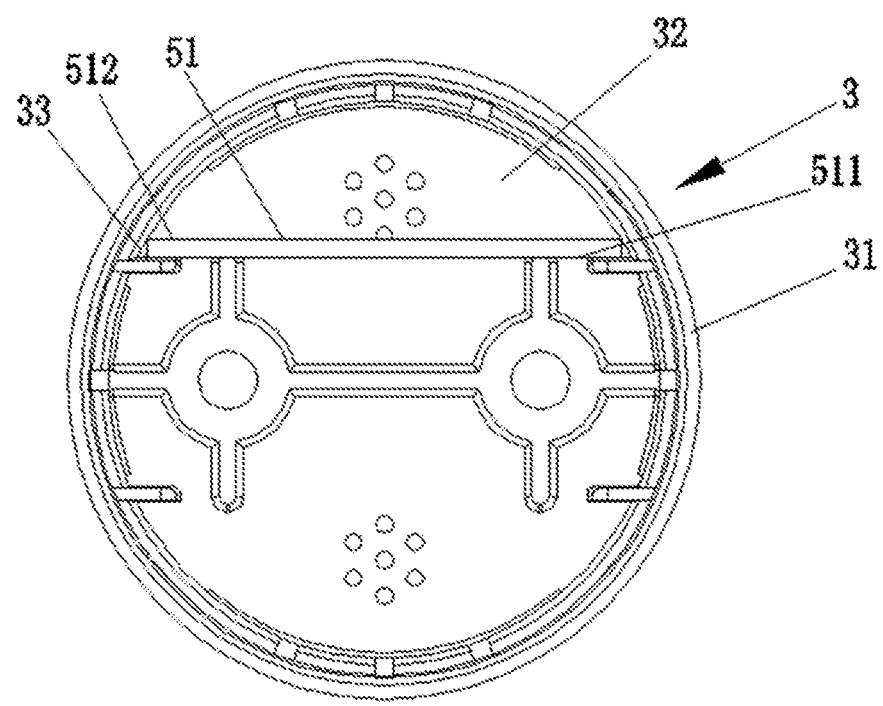
FIG. 3 illustrates a schematic diagram showing the lamp cap connected to the second circuit board in FIG. 2.
Figure 4:
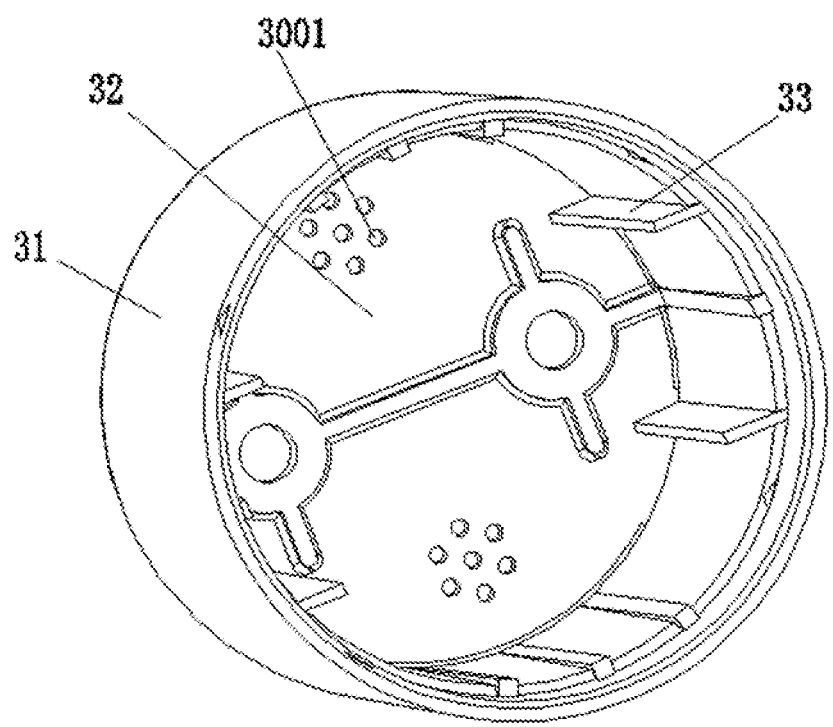
FIG. 4 illustrates a three-dimensional schematic diagram showing the lamp cap structure in FIG. 2.

Please refer to FIG. 2 to FIG. 4, the instant disclosure provides an embodiment of a lamp cap 3 which can be applied to an LED tube lamp. The lamp cap 3 includes a side wall 31 and an end wall 32. The side wall 31 is tubular. The side wall 31 and the lamp tube 1 are coaxially set and connected to each other. The meaning of coaxial is that the lamp cap 3 and the lamp tube 1 may have tolerances during manufacture, so the axes of the lamp cap 3 and the lamp tube 1 may be slightly offset, but generally the lamp cap 3 and the lamp tube 1 are coaxial. The plane of the end wall 32 is vertical or substantially vertical to the axial direction of the side wall 31, and the end wall 32 connects to the end of the side wall 31 away from the lamp tube 1. The meaning of vertical is that the end wall 32 and the side wall 31 may have tolerances during manufacture, so the end wall 32 and the side wall 31 are not 90 degrees vertical but slightly inclined, and this still belongs to the vertical range. However, even if the end wall 32 is slightly inclined with respect to the axial direction of the side wall 31, the end wall 32 and the side wall 31 may form a space for installing the power supply 5 and may match the lamp holder. The side wall 31 and the end wall 32 form an internal space of the lamp cap 3, and the power supply 5 is at least partially installed in the internal space of the lamp cap 3.

As shown in FIG. 2, the lamp cap 3 includes a first rib 33. The first rib 33 is set on the inner surface of the side wall 31 of the lamp cap 3, and the first rib 33 extends in the axial direction of the lamp cap 3. The first rib 33 may be continuously integrated in the axial direction of the lamp cap 3 or may be multi-segmented. The first rib 33 and the inner surface of the side wall 31 form a slot 35, and the second circuit board 51 is inserted into the slot 35 and fixed. In specific, please refer to FIG. 3, the second circuit board 51 has a first surface 511 and a second surface 512 which are opposite and parallel to each other, and the first surface 511 and the second surface 512 are substantially parallel to the axial direction of the lamp cap 3. When the second circuit board 51 is inserted into the slot 35 and fixed, the first surface 511 of the second circuit board 51 corresponds to the surface on the side of the first rib 33, and the second surface 512 of the second circuit board 51 corresponds to the inner surface of the side wall 31, so the second circuit board 51 is fixed. Preferably, the first surface 511 of the second circuit board 51 abuts on the first rib 33, and the edge of the second surface 512 of the second circuit board 51 abuts on the inner surface of the side wall 31 so that the circuit board 51 is fastened. In actual use, the first rib 33 are used in pairs, that is, the slot 35 is formed on the two sides of the lamp cap 3 to fasten the two sides of the second circuit board 51. As shown in FIG. 2, the slot 35 are arranged in four groups, that is, two pairs of the slots 35, and the two pairs of slots 35 are arranged symmetrically to each other. Therefore, when the lamp cap 3 is connected to the second circuit board 51, the second circuit board 51 can be selectively inserted into the two pairs of the slots 4 according to the actual position.

In this embodiment, the first rib 33 may be made of an elastic material (such as plastic). In this way, the first rib 33 may provide certain deformed space to adapt an error of the thickness or different sizes of the thickness of the second circuit board 51 during manufacture.

Please refer to FIGS. 2 to 4, a hole 3001 is set on the lamp cap 3. With the setting of the hole 3001, on the one hand, the heat generated by the power module inside the lamp cap 3 is dissipated without causing the inside of the lamp cap 3 to be in a high temperature state. On the other hand, if the humidity is too high, water vapor is formed on the inner wall of the lamp tube 1, which reduces the reliability of the internal components of the lamp cap 3. In another embodiment of the instant disclosure, the holes 3001 are symmetrically arranged with respect to the hollow conductive pin-holes of the lamp cap 3, so that no matter the second circuit board 51 is installed in any group of the slots 4, there are corresponding holes 3001 dissipating heat.

Figure 5:
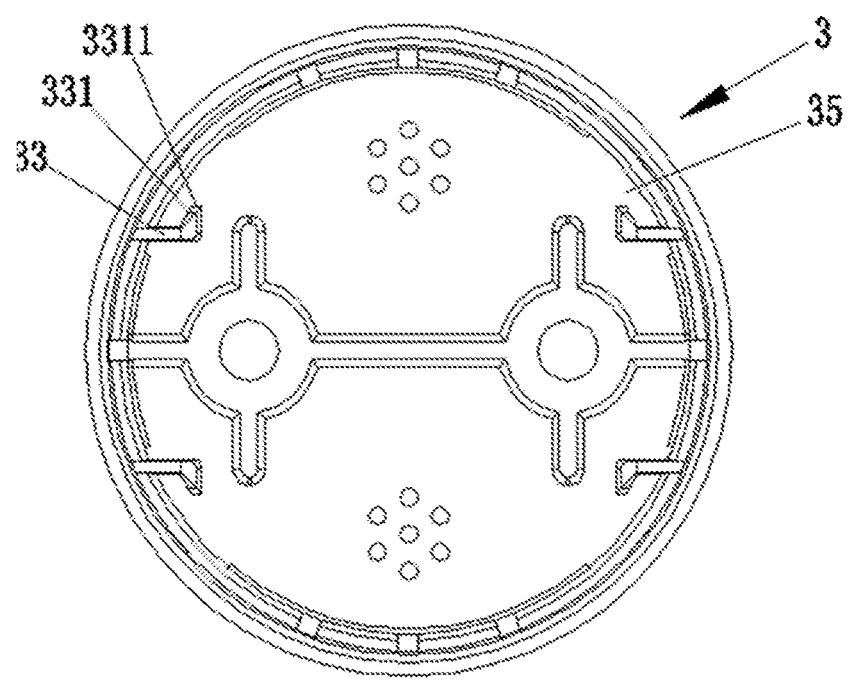
FIG. 5 illustrates a perspective diagram of a lamp cap according to an embodiment of the instant disclosure.
Figure 6:
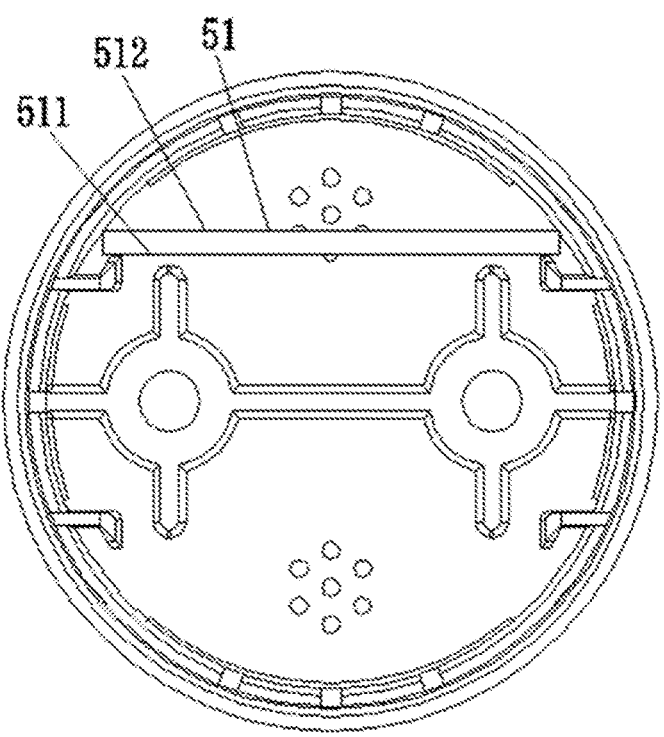
FIG. 6 illustrates a schematic diagram showing the lamp cap connected to the second circuit board in FIG. 5.
Figure 7:
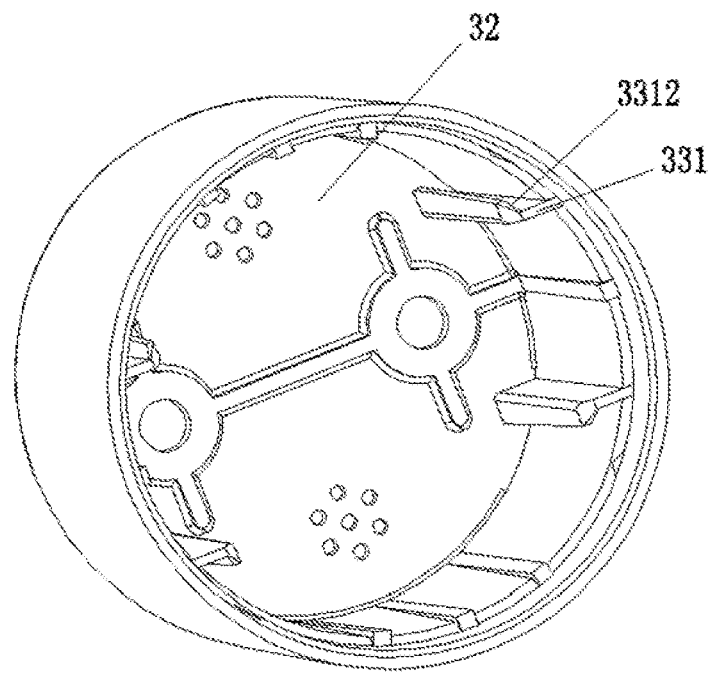
FIG. 7 illustrates a three-dimensional schematic diagram showing the lamp cap structure in FIG. 3.

As shown in FIG. 5, FIG. 6 and FIG. 7, a lamp cap 3 proposed of the instant disclosure can be applied to an LED tube lamp. The difference between the lamp cap 3 proposed in this embodiment and the lamp cap 3 (the lamp cap 3 shown in FIGS. 2 to 4) of the previous embodiment is that the first rib 33 of the lamp cap 3 is provided with an coupling structure 331, and the coupling structure 331 is protruded set on the first rib 33 with respect to one side surface of the first surface 511 of the second circuit board 51. The coupling structure 331 extends along the axial direction of the lamp cap 3, and the coupling structure 331 may be continuously integrated in the axial direction of the lamp cap 3, or may be a multi-segment type. The coupling structure 331 has a coupling surface 3311, and the coupling surface 3311 corresponds to the first surface 511 of the second circuit board 51. For example, the first surface 511 of the second circuit board 51 and the coupling surface 3311 abut. When the second circuit board 51 is fastened, the first surface 511 of the second circuit board 51 corresponds to the coupling surface 3311, and the second surface 512 thereof corresponds to the inner surface of the side wall 31, that is, the coupling surface 3311 and the inner surface of the side wall 31 forms a slot 35. Preferably, the first surface 511 of the second circuit board 51 abuts the coupling surface 3311, and the edge of the second surface 512 of the second circuit board 51 abuts the inner surface of the side wall 31, so that the second circuit board 51 is fixed. Compared with the first surface 511 of the second circuit board 51 directly corresponding to the surface on the side of the first rib 33 (the first surface 511 directly contacts the surface on the side of the first rib 33), the coupling portion 331 can narrow the contact area of the first surface 511 of the second circuit board 51 and when the first rib 33 is small, the contact area is narrowed during the process of inserting the second circuit board 51 into the lamp cap 3, which can reduce the resistance during insertion.

As shown in FIG. 7, the coupling structure 331 is provided with a first guide unit 3312 at an end of the lamp cap 3 axially away from the end wall 32. When the first guide unit 3312 is away from the end wall 32, it is opposite to the first rib 33 where the height of the surface gradually decreases. This facilitates the insertion of the second circuit board 51.

As shown in FIG. 5, the coupling structure 331 is vertical or substantially vertical to the first rib 33. When the coupling structure 331 is far from the surface of the first rib 33, the width dimension of the cross-section thereof gradually shortened. That is, the position which the coupling structure 331 is connected to the first rib 33 has the largest width. In this way, the strength of the connection between the coupling structure 331 and the first rib 33 can be increased, and breakage of the coupling structure 331 at the connection portion with the first rib 33 can be prevented during use. In some embodiments, in order to prevent the connection between the coupling structure 331 and the first rib 33 from being broken, a stress relief method may be adopted. For example, the connection portion between the coupling structure 331 and the first rib 33 is set as a circular arc transition connection (not shown in the drawing).

Figure 13:
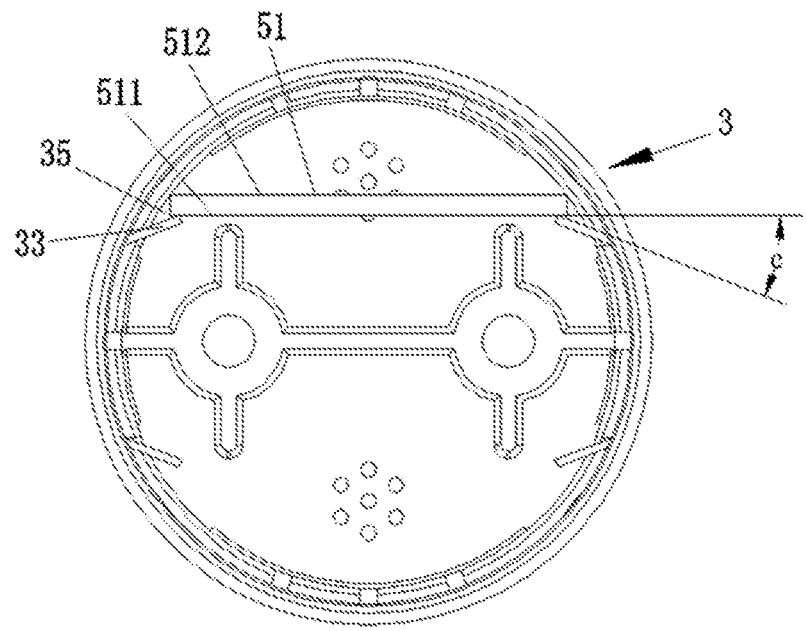
FIG. 13 illustrates a perspective diagram of showing the lamp cap structure according to other embodiments of the instant disclosure.

As shown in FIG. 13, in some embodiments, in order to narrow the contact area between the first rib 33 and the second circuit board 51, the following settings can be made. The second circuit board 51 is parallel to the axial direction of the lamp cap 3, and an angle is formed between the first rib 33 and the second circuit board 51, so that the end of the first rib 33 contacts the first surface 511 of the second circuit board 51 to narrow the contact area between the first rib 33 and the second circuit board 51 and reduce the resistance of the insertion of the second circuit board 51 into the slot 35. In this embodiment, an angle c between the first rib 33 and the second circuit board 51 is an acute angle. The contact between the first rib 33 and the second circuit board 51 is a line contact.

Figure 8:
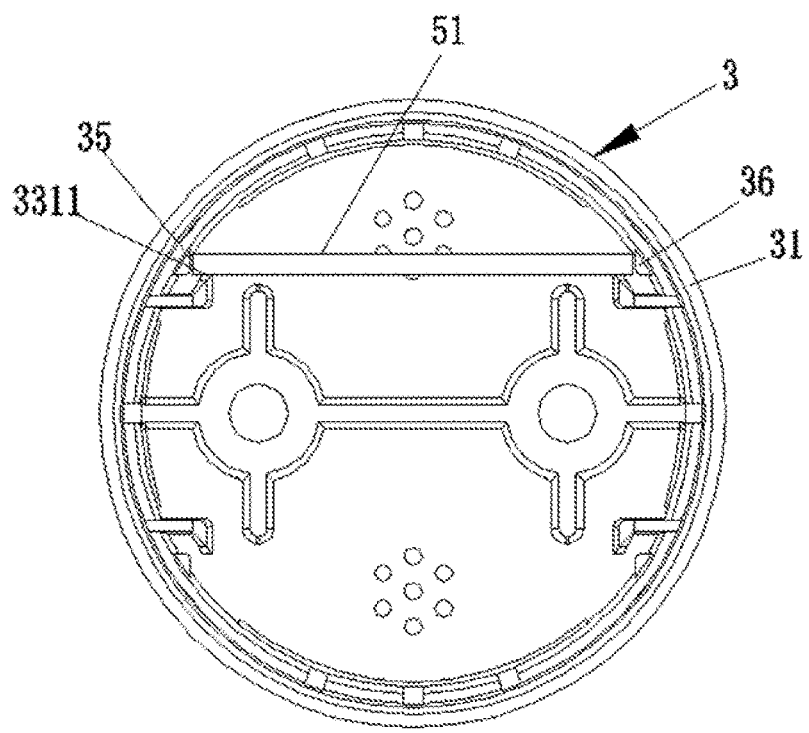
FIG. 8 illustrates a perspective diagram of showing the lamp cap connected to the second circuit board.
Figure 9:
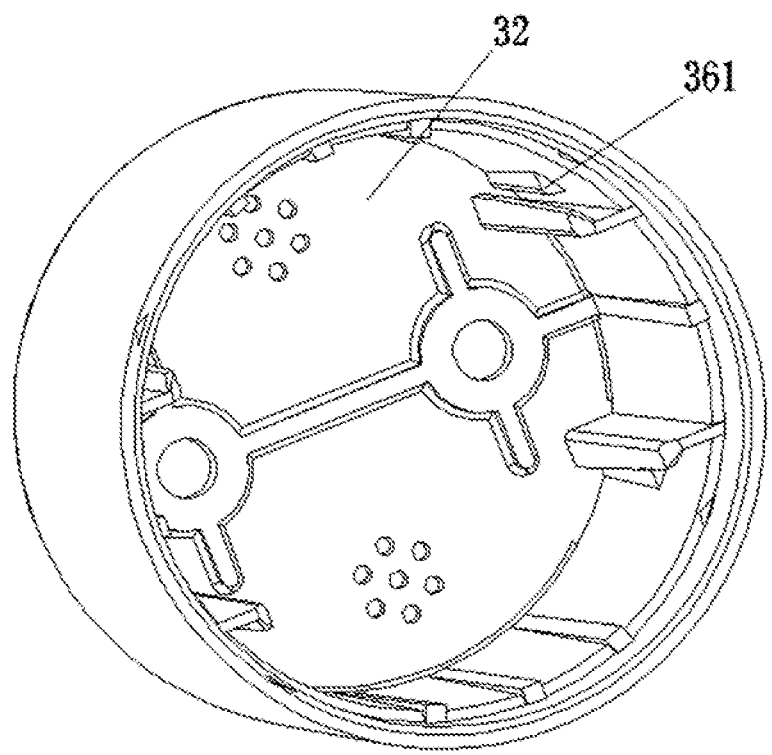
FIG. 9 illustrates a three-dimensional schematic diagram showing the lamp cap structure in FIG. 8.

As shown in FIG. 8 and FIG. 9, in this embodiment, a lamp cap 3 can be applied to an LED tube lamp. The difference between the lamp cap 3 of this embodiment and the lamp cap 3 (the lamp cap 3 shown in FIGS. 5 to 7) of the foregoing embodiment is that the lamp cap 3 further includes a positioning unit 36 provided on the inner surface of the side wall 31, It is extended along the axial direction of the lamp cap 3. The positioning unit 36 corresponds to the side surface of the second circuit board 51 to limit the side surface of the second circuit board 51 and prevent the second circuit board 51 from being deflected from the axial direction of the lamp cap 3, thereby causing the second circuit board 51 skewed and cannot be inserted when the card slot 35 is inserted.

As shown in FIG. 8, the positioning unit 36 maintains a gap with the side of the second circuit board 51 to prevent the positioning unit 36 from generating a certain resistance when the second circuit board 51 is inserted into the slot 35. The positioning unit 36 is continuously integrated in the axial direction of the lamp cap 3.

As shown in FIG. 8, the position of the positioning unit 36 does not exceed the position of the coupling surface 3311 in the width of the lamp cap 3. In order to prevent the set-up of the positioning unit 36 from affecting the depth of the slot 35 in the width of the lamp cap 3.

As shown in FIG. 9, a second guide unit 361 features the positioning unit 36 away from the end wall 32 at an end of the lamp cap 3 in the axial direction. As the second guide unit 361 moves away from the end wall 32, the height of the opposing second guide unit 361 of the inner surface of the side wall 31 gradually descended. This facilitates the insertion of the second circuit board 51.

Figure 10:
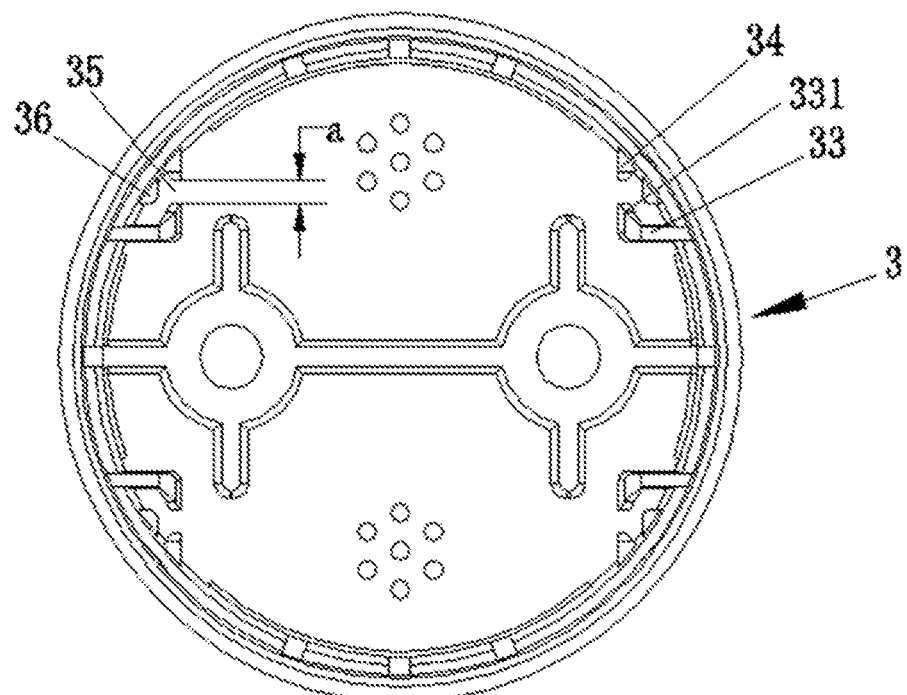
FIG. 10 illustrates a perspective diagram of showing the lamp cap according to an embodiment of the instant disclosure.
Figure 11:
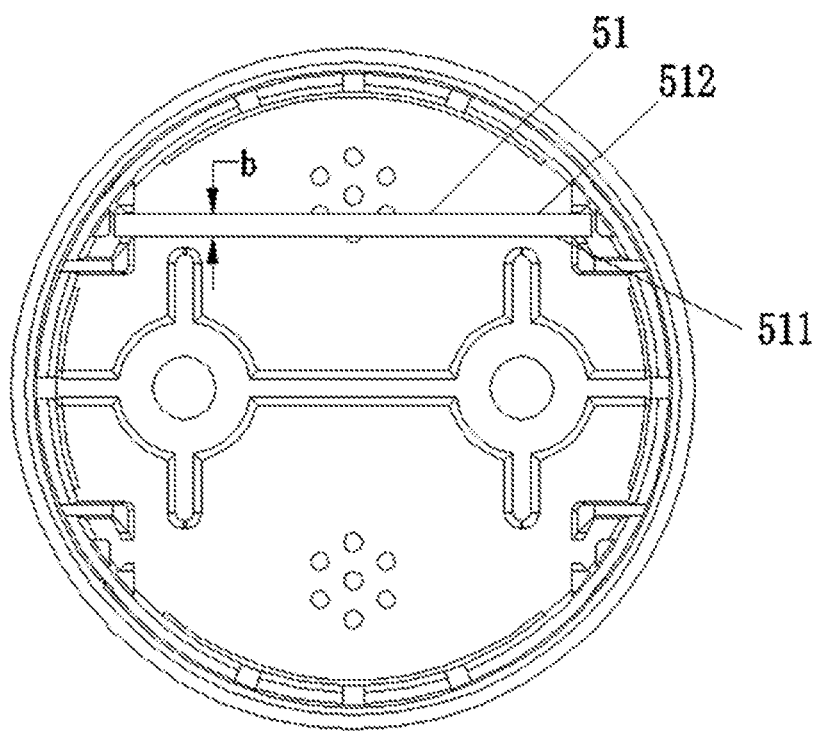
FIG. 11 illustrates a schematic diagram showing the lamp cap connected to the second circuit board in FIG. 10.
Figure 12:
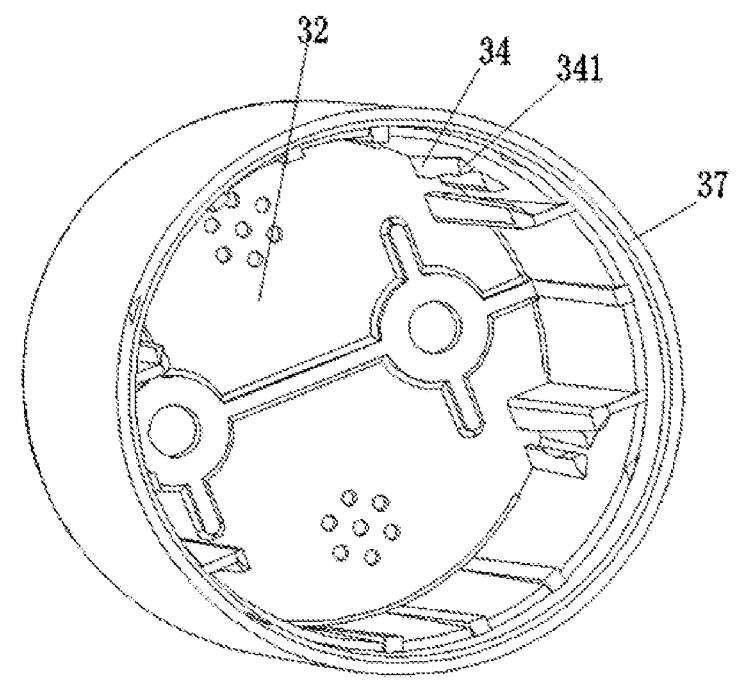
FIG. 12 illustrates a three-dimensional schematic diagram showing the lamp cap structure in FIG. 10.

As shown in FIG. 10, FIG. 11, and FIG. 12, in this embodiment, a lamp cap 3 can be applied to an LED tube lamp. The difference between the lamp cap 3 of this embodiment and the lamp cap 3 (the lamp cap 3 shown in FIGS. 8 to 9) of the foregoing embodiments is that the lamp cap 3 further includes a second rib 34. A slot 35 is formed between the first rib 33 (the coupling structure 331 of the first rib 33) and the second rib 34, and the second rib 34 is protruded from the inner surface of the side wall 31. That is, the first surface 511 of the second circuit board 51 corresponds to the first rib 33 (the coupling structure 331 of the first rib 33), and the second surface 512 of the second circuit board 51 corresponds to the second rib 34. The side surface of the second circuit board 51 corresponds to the positioning unit 36. As shown in FIG. 10, the second rib 34 is vertical to the first rib 33, and an end portion of the second rib 34 corresponds to the coupling structure 331 of the first rib 33. By making the second rib 34 vertical to the first rib 33 and using the lower end portion of the second rib 34 to correspond to the coupling structure 331, in use, only the end portion of the second rib 34 contacts the second circuit board 51, which can narrow the contact area between the second rib 34 and the second circuit board 51 is to reduce the resistance when the second circuit board 51 is inserted.

As shown in FIGS. 10 and 11, the ratio of the width a of the slot 35 to the thickness b of the second circuit board 51 is 1:0.9 to 1:1.25. Since the first rib 33 is made of an elastic material, the slot 35 is compatible with a certain range of the thickness of the second circuit board 51 which has a wider applicable field. Preferably, the ratio of the width a of the slot 35 to the thickness b of the second circuit board 51 is 1:1 to 1:1.2, so the second circuit board 51 does not loosen after being inserted into the slot 35.

As shown in FIG. 11 and FIG. 12, the second rib 34 extends in the axial direction of the lamp cap 3. A third guide portion 341 is set at the end of the second rib 34 away from the end wall 32 in the axial direction of the lamp cap 3. When the third guide portion 341 moves away from the end wall 32, the height of the third guide portion 341 gradually descends. This facilitates the insertion of the second circuit board 51.

The ratio of the thickness of the first rib 33 to the thickness of the side wall 31 (to the thickness of the side wall 31 partially in contact with the first rib 33) is between 1:0.8 and 1:2.5. That is, the thickness of the first rib 33 and the thickness of the side wall 31 are relatively uniform. The first rib 33 and the lamp cap 3 by resin are integrally molded. When the first rib 33 is formed on the inner surface of the side wall 31 at certain thickness (in the case where the wall thickness is relatively uniform), the outer surface of the side wall 31 is formed less likely to leave marks. If the thickness of the first rib 33 is too thick (beyond the above ratio), on one hand, it will affect the elasticity of the first rib 33, and further affect the insertion of the second circuit board 51; on the other hand, due to the flow ability and internal stress of the resin when the outer surface of the side wall 31 is formed, a mark (a shrinkage mark) is formed on the outer surface of the side wall 31, and the lamp cap 3 is defective.

As shown in FIG. 7, FIG. 9 and FIG. 12, the first guide portion 3312, the second guide portion 361, and the third guide portion 341 are all set relatively to the direction of the slot 35 so that they can operate in the second circuit board 51.

As shown in FIG. 10, FIG. 11 and FIG. 12, a proximal end 37 is set at the other end of the lamp cap 3 axially opposite to the end wall 32. The distance between the proximal end 37 and the end of the first rib 33 close to the proximal end 37 in the axial direction and the proximal end 37 and the end of the second rib 34 close to the proximal end 37 in the axial direction is different. Preferably, the distance between the proximal end 37 and the end of the first rib 33 close to the proximal end 37 in the axial direction is shorter than the distance between the proximal end 37 and the end of the second rib 33 close to the proximal end 37 in the axial direction. That is, the second circuit board 51 first corresponds to the first rib 33 during the insertion process, and the first rib 33 supports or guides the second circuit board 51, and then corresponds to the second rib 34 (the second circuit board 51 is inserted into the slot 35), thereby facilitating the insertion of the second circuit board 51. If the distance between the proximal end 37 and the end of the first rib 33 close to the proximal end 37 in the axial direction is equal to the distance between the proximal end 37 and the end of the second rib 34 close to the proximal end 37 in the axial direction. It is necessary for the second circuit board 51 at the beginning needs to align with the entrance of the slot 35, which increases the difficulty of the insertion of the second circuit board 51.

Figure 14:
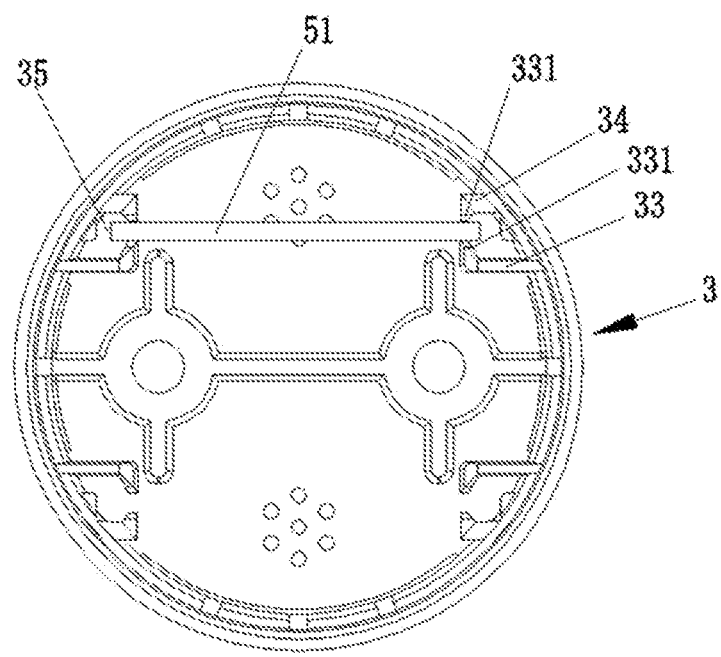
FIG. 14 illustrates a perspective diagram of showing the lamp cap structure according to an embodiment of the instant disclosure.

As shown in FIG. 14, in this embodiment, a lamp cap 3 can be applied to an LED tube lamp. The difference between the lamp cap 3 of this embodiment and the lamp cap 3 (the lamp cap 3 shown in FIGS. 10 to 12) of the previous embodiments is that the second rib 34 is convexly set on the inner surface of the side wall 31, and the second rib 34 is parallel or substantially parallel to the first rib 33. The first rib 33 and the second rib 34 form a slot 35, and the second circuit board 51 is snapped into the slot 35 for fastening. In order to narrow the contact area between the slot 35 and the second circuit board 51, a coupling structure 331 is set on at least one of the first rib 33 and the second rib 34. Preferably, a coupling structure 331 is set on the first rib 33 and the second rib 34 each.

In the above embodiments, when the second circuit board 51 is installed in the end cap 3, the second circuit board 51 and the shaft center of the lamp cap 3 maintain a distance. Therefore, the first surface 511 of the second circuit board 51 corresponds to more space in the lamp cap 3, and the second surface 512 of the second circuit board 51 corresponds to a relatively small space in the lamp cap 3. Therefore, the electronic components of the power supply 5 are being set, the first surface 511 is set on larger electronic components, such as capacitors, transformers, inductors, etc., and the second surface 512 is set on smaller electronic components, such as chip resistors, chip capacitor, IC (control circuit).

Figure 15:
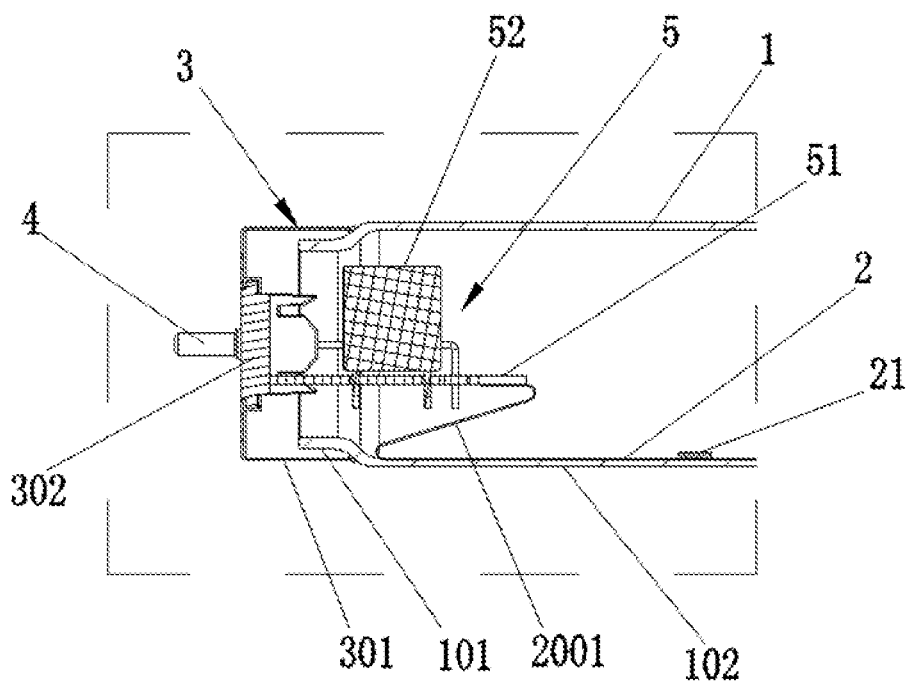
FIG. 15 illustrates a partially steric cross section of the lamp cap structure according to an embodiment of the instant disclosure.
Figure 16:
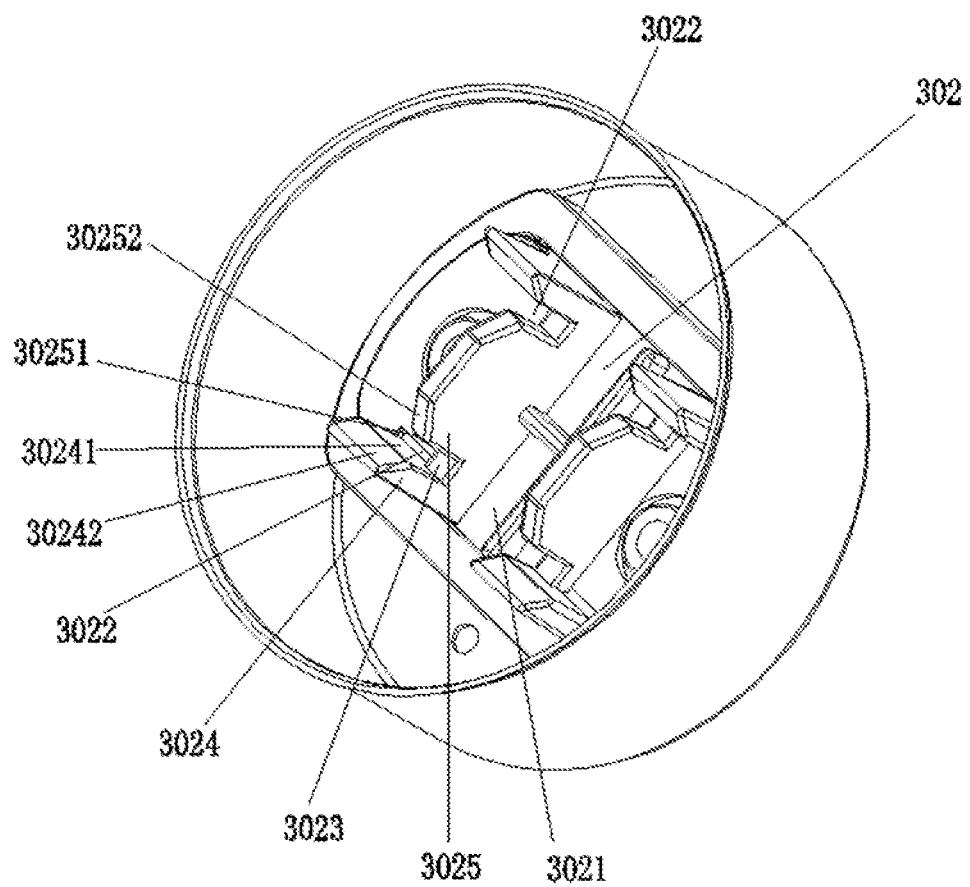
FIG. 16 illustrates a three-dimensional schematic diagram showing the lamp cap structure.

Referring to FIG. 15 and FIG. 16, in this embodiment, a lamp cap 3 can be applied to an LED tube lamp. The lamp cap 3 includes a body 301 and an insulating portion 302. The insulating portion 302 constitutes at least a part of an end portion of the lamp cap 3, and a hollow conductive pin 4 is disposed on the insulating portion 302. The insulating portion 302 has an inner side surface 3021, and a slot 3022 is set on the inner side surface 3021. The longitudinal width of the slot 3022 matches with the second circuit board 51 so that the second circuit board 51 can be inserted into the slot 3022 for fastening. This achieves the function of fastening the power supply 5 in the lamp cap 3. In specific, the slot 3022 restricts the power supply 5 from moving in the up and down direction on the surface of the second circuit board 51. The material of the body 301 in this embodiment is aluminum or an aluminum alloy, and the insulating portion 302 is made of an insulating material, such as plastic, ceramic, or the like. In this embodiment, two sets of the slots 3022 are installed, and the two sets of the slots 3022 are symmetrically installed on the insulating portion 302. The second circuit board 51 can be inserted into one of the two sets of the slots 3022 according to actual assembly conditions. Specifically, the two sets of the slots 3022 are symmetrically installed with respect to a plane passing through the axis of the lamp tube 1 and parallel to the plane of the second circuit board 51.

Figure 17:
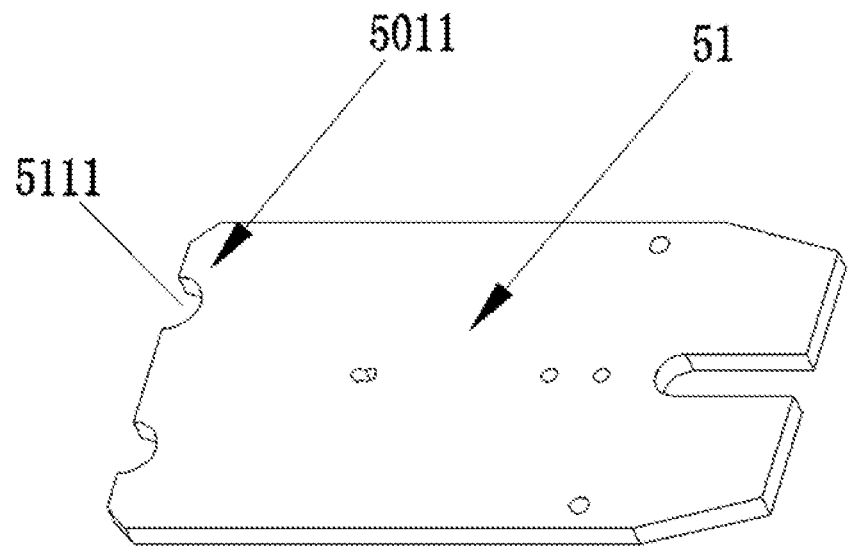
FIG. 17 illustrates a three-dimensional schematic diagram showing the second circuit board structure.

Please refer to FIG. 15, FIG. 16 and FIG. 17, in this embodiment, the insulating portion 302 includes a bottom wall 3023, a first side wall 3024, and a second side wall 3025, and the bottom wall 3023, the first side wall 3024, and the second side wall 3025 form the slot 3022 and the end of the bottom wall 3023 form the bottom of the slot 3022. The end of the bottom wall 3023 and the inner side surface 3021 maintain space. Therefore, after the second circuit board 51 of the power supply 5 is inserted into the slot 3022, the second circuit board 51 can maintain space from the inner side surface 3021 to provide air flowing passage for space convection above and below the second circuit board 51.

Please refer to FIG. 16 and FIG. 17, in this embodiment, the first side wall 3024 has a first coupling surface 30241, the second side wall 3025 has a second coupling surface 30251, the first coupling surface 30241, and the second coupling surface 30251 collectively constitutes side walls on both sides of the slot 3022. In this embodiment, the width or area of the first coupling surface 30241 is configured to be larger than the width or area of the second coupling surface 30251 (the width refers to the dimension along the width direction of the lamp tube 1). During the insertion of the second circuit board 51 into the slot 3022, the second coupling surface 30251 provides a small frictional force when it comes into contact with the second circuit board 51 due to the small width or area; and the second circuit board 51 after the slot 3022 is inserted, the first coupling surface 30241 provides better support for the second circuit board 51 due to the larger width or area, so as to improve the stability of the power supply 5 for fastening.

Please refer to FIG. 16 and FIG. 17, in this embodiment, the first side wall 3024 has a first guide surface 30242 while the second side wall 3025 has a second guide surface 30252. The first guide surface 30242 and the second guide surface 30252 together form an opening of the slot 3022 to facilitate the second circuit board 51 inserted into the slot 3022 through the opening.

Please refer to FIG. 16 and FIG. 17, in this embodiment, a limiting portion 5011 is set on an end portion of the second circuit board 51, and the bottom wall 3023 of the limiting portion 5011 is matched to restrict the movement from the second circuit board 51 in the width direction.

In specific, the limiting portion 5011 includes a notch 5111, and the bottom wall 3023 is stuck in the notch 5111, so as to restrict the movement from the second circuit board 51 in the width direction. The notch 5111 in this embodiment has a circular arc shape.

In this embodiment, the ratio of the depth of the slot 3022 to the length of the second circuit board 51 is at least 0.08 or more to improve the stability of fastening the second circuit board 51 to the slot 3022. Preferably, the ratio of the depth of the slot 3022 to the length of the second circuit board 51 is at least 0.1 or more. More preferably, the ratio of the depth of the slot 3022 to the length of the second circuit board 51 is at least 0.12 or more. The specific size of the depth of the slot 3022 in this embodiment is 2 to 5 mm.

In this embodiment, the ratio of the width of the slot 3022 to the thickness of the second circuit board 51 is 0.9:1 to 1.2:1 to achieve a proper degree of tightness. On one hand, the ratio is to prevent the circuit layer of the second circuit board 51 damaged by the card slot 3022 when the second circuit board 51 is inserted into the slot 3022. On the other hand, the ratio is to prevent the excessive space resulting in shaking of the power supply 5 when the second circuit board 51 is inserted into the slot 3022. Preferably, the ratio of the width of the slot 3022 to the thickness of the second circuit board 51 is 0.95:1 to 1.1:1. More preferably, the ratio of the width of the slot 3022 to the thickness of the second circuit board 51 is 0.95:1 to 1:1.

Figure 18:
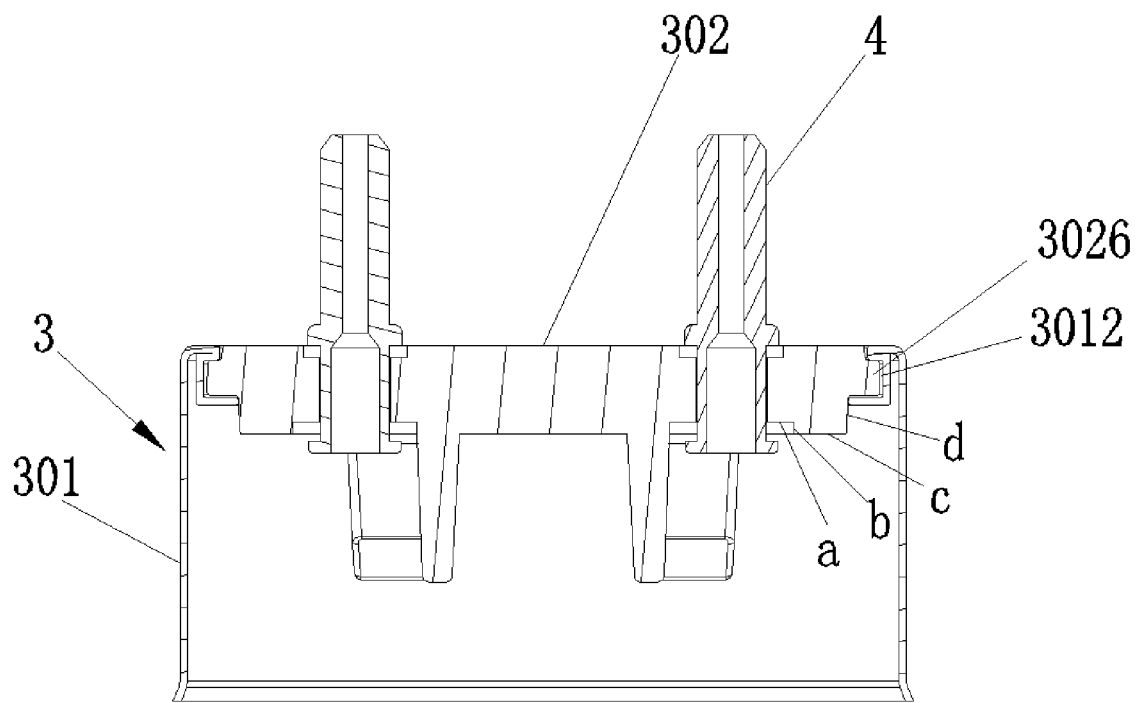
FIG. 18 illustrates a cross section diagram of the lamp cap structure.

Please refer to FIG. 18, in this embodiment, in order to raise the withstand voltage value of the lamp cap 3, a certain straight-lined distance is maintained between the hollow conductive pin 4 and the body 301 of the lamp cap 3 through the arrangement of the insulating portion 302. Preferably, the cumulative creepage distance between the hollow conductive pin 4 and the body 301 of the lamp cap 3 is at least 4 mm in total. More preferably, the cumulative creepage distance between the hollow conductive pin 4 and the body 301 of the lamp cap 3 is at least 4.5 mm. Preferably, the cumulative creepage distance between the hollow conductive pin 4 and the body 301 of the lamp cap 3 is at least 5 mm. As shown in FIG. 18, the creepage distance between the hollow conductive pin 4 and the body 301 of the lamp cap 3 is divided into four sections of lengths a, b, c, and d, which satisfies: a+b+c+d≥4 mm.

In this embodiment, in order to accommodate the end of the hollow conductive pin 4 in the width direction, the dimension of a is 0.5 mm to 1 mm to facilitate the installing and fastening of the hollow conductive pin 4 (the end portion of the hollow conductive pin 4 is protruding in the radial direction compared to the body of the hollow conductive pin 4).

In this embodiment, in order to accommodate the end of the hollow conductive pin 4 in the length direction, the dimension of b is 0.35 mm to 0.5 mm.

In this embodiment, the dimension of c is 1.8 mm to 3 mm to ensure the mechanical strength of the insulating portion 302.

Figure 19:
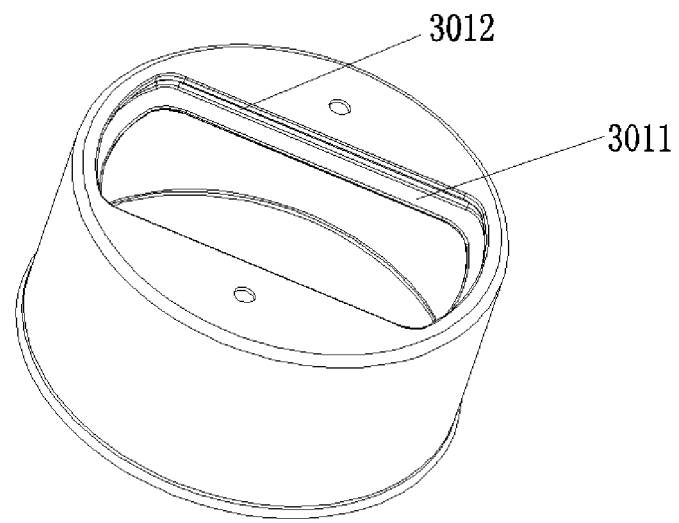
FIG. 19 illustrates a three-dimensional schematic diagram showing the second circuit board structure.

Please refer to FIG. 18 and FIG. 19, in this embodiment, a convex portion 3026 is set on the outer edge of the insulation portion 302, and a hole 311 at the end of the body 301 substantially matches the outer contour of the insulation portion 302. By pressing the body 301 forms a groove 3012, so that the convex portion 3026 is disposed in the groove 3012, and the insulating portion 302 is fastened.

In this embodiment, the shortest distance between the second circuit board 51 and the inner wall of the body 301 in the width direction of the lamp tube 1 is greater than 3 mm to ensure that the second circuit board 51 has a sufficient space from the body 301. Compared with the existing metal lamp cap, the existing metal lamp cap fails to effectively fasten the second circuit board 51 of the power supply 5. Therefore, the distance between the inner wall of the body 301 of the existing metal lamp cap and the second circuit board 51 cannot be fastened, which may easily result in the second circuit board 51 contacting the body of the metal lamp cap, leaving a hidden safety issue.

Please refer to FIG. 15, the lamp tube 1 in this embodiment includes a body region 102 and end region 101 respectively disposed at two ends of the body region 102. The body 21 of the lamp cap 3 is sleeved on the end region 101. The outer diameter of the tip region 101 is smaller than the outer diameter of the body region 102. The lamp cap 3 is sleeved on the end region 101, and the difference between the outer diameter of the lamp cap 3 and the outer diameter of the lamp body region 102 becomes smaller or completely flat, or the outer diameter of the lamp cap 3 is smaller than the outer diameter of the lamp body region 102. The benefit of this arrangement is that during transportation, the package support does not easily contact the lamp cap 3, so that the lamp cap 3 does not become the only stress point, and the portion where the lamp cap 3 is connected to end region 101 of the lamp tube 1 is broken due to stress concentration which improves the quality and aesthetics of the product.

In this embodiment, the first circuit board 2 is a soft circuit board or a flexible circuit board, and most areas of the first circuit board 2 (for example, more than 90% of the areas) are fastened to the inner surface of the lamp tube 1 and are not fastened to a portion of the inner surface of the lamp tube 1 to form a free portion 2001, and the free portion 2001 and the second circuit board 51 are fastened by welding. During assembly, the soldered end of the free part 2001 and the second circuit board 51 will drive the free part 51 to shrink into the interior of the lamp tube 1 and finally form an "S" or "Z" shape (viewed from the side of the lamp tube 1).

In this embodiment, the second circuit board 51 has a first surface and a second surface, wherein an electronic component 52 is installed on the first surface, and the electronic component 52 includes a capacitor, an electrolytic capacitor, a fuse, or a transformer. The distance between the portion of the first circuit board 2 attached to the inner surface of the lamp tube 1 and the second surface of the second circuit board 51 in the width direction of the lamp tube 1 is greater than 3.5 mm. To ensure that there is enough space between the two to accommodate the free portion 2001, to prevent the pins of the electronic component 52 on the second circuit board 51 from damaging the free portion 2001 of the first circuit board 2. In addition, the distance between the portion of the first circuit board 2 attached to the inner surface of the lamp tube 1 and the second surface of the second circuit board 51 in the width direction of the lamp tube 1 is less than half the diameter of the inner surface of the lamp tube 1 in order to ensure that there is sufficient space between the first surface of the second circuit board 51 and the inner surface of the lamp tube 1 to accommodate the electronic component 2.

In this embodiment, the LED tube lamp is model T8 and the outer diameter of the lamp tube 1 is around 25.4 mm.

Figure 20:
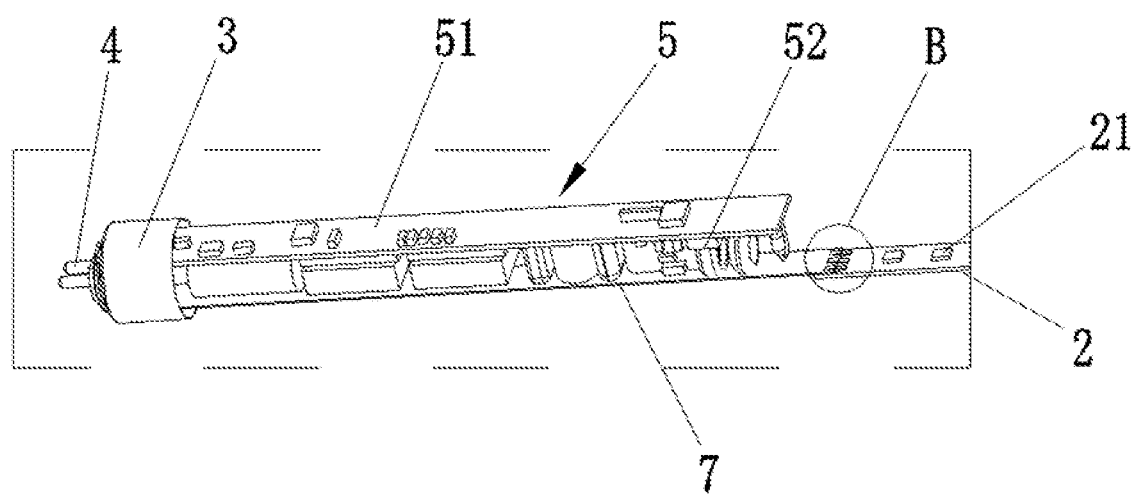
FIG. 20 illustrates a partial diagram showing the connection structure of the power supply and the first circuit board according to an embodiment of the instant disclosure.

Please refer to FIG. 20, in some embodiments, the present disclosure provides a connection structure between a power supply 5 and a first circuit board 2, which can be applied to an LED tube lamp, wherein the first circuit board 2 and the second circuit board 51 are connected through a connection portion. The connection portion can be a wire, a male and a female plug, and a pin. The connection portion in this embodiment adopts a third circuit board 7, that is, the first circuit board 2 and the second circuit board 51 are connected through the third circuit board 7, so that the light source 21 and the power supply 5 are electrically connected.

In some embodiments, the thermal conductivity of the first circuit board 2 is better than that of the third circuit board 7. In specific, the thermal conductivity coefficient of the first circuit board 2 is higher than that of the third circuit board 7, or during the unit time the first circuit board 2 can conduct more heat than the third circuit board 7 (assuming other conditions are the same). Therefore, the heat generated during the operation of the light source 21 can be quickly conducted to the lamp tube 1 through the first circuit board 2 and dissipated to the outside through the lamp tube 1. In addition, the heat generated by the light source 21 is not easily conducted to the third circuit board 7, thereby impacting the power supply 5.

In some embodiments, the thermal conductivity of the third circuit board 7 is better than that of the second circuit board 51. In specific, the thermal conductivity coefficient of the third circuit board 7 is higher than that of the second circuit board 51, or during the unit time the third circuit board 7 can conduct more heat than the second circuit board 51 (assuming other conditions are the same). The electronic component 52 of the power supply 5 includes a heating element, such as a resistor, a transformer, an inductor, an IC (Integrated Circuit), etc. In order to improve the heat dissipation of the power supply 5, at least one of the heating elements of the electronic component 52 can thermally contact the third circuit board 7 and the third circuit board 7 can thermally contact the lamp tube 1, so that a portion of the power supply 5 can be thermally conducted to the lamp tube 1 through the third circuit board 7 for heat dissipation. In some embodiments, the heating elements of the electronic component 52 may also contact the third circuit board 7 indirectly by dissipating heat in the form of heat radiation to the third circuit board 7.

In summary, the thermal conductivity coefficient of the first circuit board 2, the third circuit board 7, and the second circuit board 51 decreases in order.

In this embodiment, the hardness of the first circuit board 2 is greater than that of the third circuit board 7. Therefore, to the first circuit board 2, the first circuit board 2 can better carry and support the light source 21, and as to the third circuit board 7 the foldable feature can make the first circuit board 2 and the second circuit board 51 be connected through the third circuit board 7 with more adjustable space and facilitating the connection. In this embodiment, the first circuit board 2 may be either one of a strip-shaped aluminum substrate and a glass cloth substrate (FR4).

In this embodiment, the hardness of the second circuit board 51 is greater than that of the third circuit board 7. To the second circuit board 51, the second circuit board 51 can better carry and support the electronic components 52 of the power supply 5. When the power supply 5 and the third circuit board 7 are stacked, the third circuit board 7 can be bent and deformed to adapt to the power supply 5 to prevent the setting of the third circuit board 7 from affecting the normal installation of the power supply 5.

In specific, in this embodiment, the first circuit board 2 is fastened on the inner surface of the lamp tube 1 while the third circuit board 7 is not fastened on the inner surface of the lamp tube 1. The third circuit board 7 may be a soft circuit board or a flexible circuit board. There are two ends disposed on the second circuit board 51 in the axial direction of the lamp tube 1 (the first end and the second end, where the first end is closer to the matching lamp cap 3) and one end is closer to the matching lamp cap 3, the second circuit board 51 is closer to one end of the matching lamp cap 3 and connected to one end of the third circuit board 7 while the other end of the third circuit board 7 is connected to the first circuit board 2. During the installation and connection process, the second circuit board 51 can be inserted into the lamp tube 1 first, and connect one end of the matching lamp cap 3 closer to the second circuit board 51 to one end of the third circuit board 7. The second circuit board 51 is closer to one end of the matching lamp cap 3 connected to one end of the third circuit board 7. Because insertion is completed in advance, there is no need to connect the second circuit board 51 to the first circuit board 2 as in the prior art, and then insert the second circuit board 51 into the lamp tube 1 as a whole, thereby lowering the difficulty of the production process and solving the problem that the second circuit board 51 is difficult to insert in the prior art.

In this embodiment, the second circuit board 51 and the third circuit board 7 may be connected through connectors such as male and female plugs, pin headers, or the second circuit board 51 and the third circuit board 7 may be directly soldered.

Figure 21:
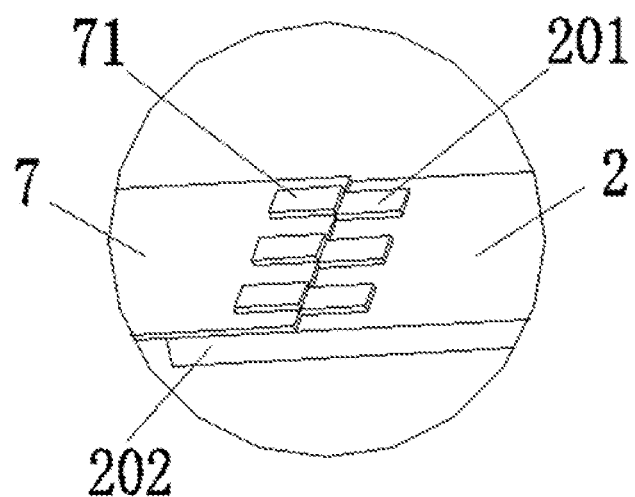
FIG. 21 illustrates a zoom-in diagram showing the structure B in FIG. 20.

Please refer to FIG. 20 and FIG. 21, in this embodiment, the connection between the third circuit board 7 and the first circuit board 2 may be directly soldered, or adopted a male and female plug, a pin, or the like for connection. Preferably, the third circuit board 7 and the first circuit board 2 in this embodiment are connected by soldering. Specifically, there is a first pad 201 at one end of the first circuit board 2, and there is a second pad 71 at one end of the third circuit board 7 where the first pad 201 and the second pad 71 are directly soldered (connected by soldering).

In this embodiment, the first pad 201 is spaced from the length end of the first circuit board 2 to form a connection section 202. One end of the third circuit board 7 is placed on the connection section 202 and the second pad 71 corresponds to the first pad 201 in the length direction of the lamp tube 1. The connecting section 202 is a part of the first circuit board 2, and its hardness is greater than that of the third circuit board 7. Therefore, the third circuit board 7 can better support and facilitate the connection. When the third circuit board 7 is placed on the connection section, the end of the third circuit board 7 rests on the first pad 201 (or maintain a minimum distance, such as the distance between the end of the third circuit board 7 and the first pad 201 in the length direction of the lamp tube 1 is less than 0.5 mm). At this time, the first pad 201 and the second pad 71 may be in contact with each other, or keeping smaller distance to further facilitate connection. In this embodiment, the number of the first pad 201 and the second pad 71 are three sets each, and each of them corresponds to each other. The quantity of the first pad 201 and the second pad 71 is not limited to this embodiment, and the specific quantity depends on the circuit design requirement.

In this embodiment, the first pad 201 is disposed on a side of the first circuit board 2 with the light source 21. The second pad 71 is disposed on a side of the third circuit board 7 relatively close to a side of the electronic component 52.

When the second circuit board 51 and the third circuit board 7 are actually connected, the ends of the second circuit board 51 and the third circuit board 7 are partially exposed outside of the lamp tube 1, and the ends of the second circuit board 51 and the third circuit board 7 are connected outside the lamp tube 1. After the second circuit board 51 and the third circuit board 7 are connected, they are pushed into the lamp tube 1. Under this premise, the third circuit board 7 is allocated a soft circuit board, so that when the second circuit board 51 and the third circuit board 7 are inserted into the lamp tube 1, the third circuit board 7 can be bent to complete the above-mentioned actions. In this embodiment, when the third circuit board 7 is in the flat-straight state, the end portion of the third circuit board 7 at least partially extends beyond the lamp tube 1 in the axial direction of the lamp tube 1.

In this embodiment, the second circuit board 51 and the third circuit board 7 are separated by an electronic component 52, thereby reducing the risk of ignition caused by the second circuit board 51 contacting the third circuit board 7. The above-mentioned electronic component 52 includes relatively large-volume components such as capacitors, transformers, and inductors to ensure a sufficient distance between the second circuit board 51 and the third circuit board 7.

In this embodiment, in terms of the width direction of the lamp tube 1, the second circuit board 51 and the third circuit board 7 are disposed at opposite sides of the lamp tube 1. In other words, a central axis is in the lamp tube, and the central axis passes through the lamp tube 1 parallel to the plane of the second circuit board 51. At this time, the second circuit board 51 and the third circuit board 7 are respectively disposed on both sides of the plane. In this way, it is ensured that the first circuit board 2 and the second circuit board 51 have a certain interval, thereby lowering the risk of fire because the first circuit board 2 contacts the second circuit board 51.

In this embodiment, the thickness of the third circuit board 7 is smaller than the thickness of the second circuit board 51. When the power supply 5 and the third circuit board 7 are stacked and the inner diameter of the lamp tube 1 is the same, controlling the thickness of the third circuit board 7 can provide more space for the power supply 5 to facilitate the power supply 5 to more easily select and arrange the electronic components 52. In this embodiment, the thickness of the third circuit board 7 is also smaller than the thickness of the first circuit board 2.

Figure 22:
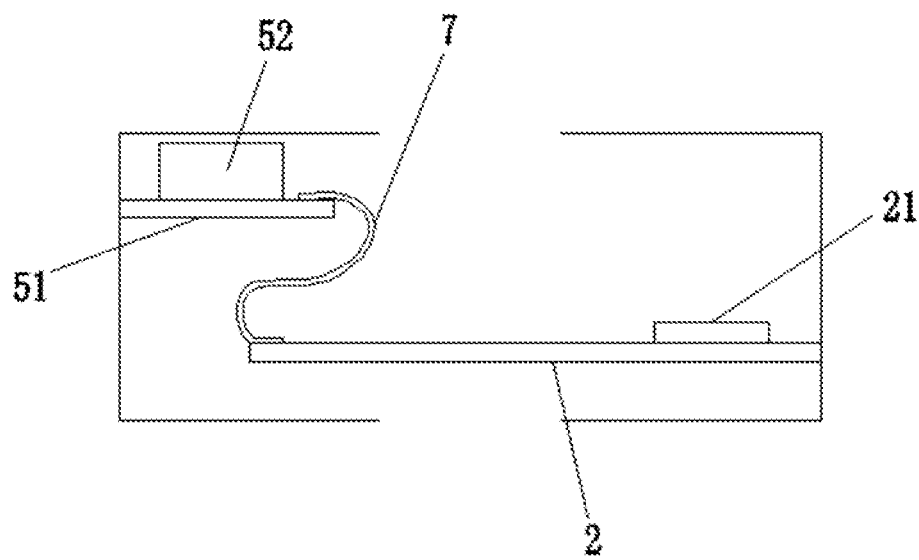
FIG. 22 illustrates a partial schematic diagram showing the connection structure of the second circuit board and the first circuit board according to other embodiments of the instant disclosure.

Please refer to FIG. 22, in some embodiments, an LED tube lamp which the basic structure is the same as the LED tube lamp of the previous embodiments, except that the first circuit board 2 is fastened on the inner surface of the lamp tube 1 while the third circuit board 7 is not fastened on the inner surface of the lamp tube 1. The third circuit board 7 may be a soft circuit board or a flexible circuit board.

There are a first end and a second end on the second circuit board 51 in the axial direction of the lamp tube 1, wherein the first end is closer to the matched lamp cap 3, and the second end of the second circuit board 51 is connected to the third circuit board 7 while the other end of the third circuit board 7 is connected to the first circuit board 2. During the assembly and connection process, the second circuit board 51 is completely exposed outside of the lamp tube 1, so that the second end thereof is exposed outside of the lamp tube 1, and the end of the third circuit board 7 is exposed outside of the lamp tube 1, thereby facilitating the second end of the second circuit board 51 connected to the end of the third circuit board 7. After the connection is completed, the second circuit board 51 is pushed into the lamp tube 1. In this embodiment the second circuit board 51 and the third circuit board 7 may be connected through male and female plugs and pin header connectors, or the second circuit board 51 and the third circuit board 7 may be directly soldered together.

Please refer to FIG. 23 to FIG. 29, in some embodiments, a connection method between a power supply 5 and a hollow conductive pin 4 is disclosed. The LED tube lamp in these embodiments includes a connecting wire 8, and the hollow conductive pin 4 is fastened on the lamp cap 3. One end of the connecting wire 8 is electrically connected to the hollow conductive pin 4 (the connecting wire 8 and the hollow conductive pin 4 are electrically connected through contact), the other end of the connecting wire 8 is connected to the second circuit board 51, and the connecting wire 8 is configured to reach a certain degree of the temperature when fusing occurs (for instance when the temperature reaches 300° C.), that is, when the LED tube lamp operates and arcing occurs, and reaching a certain temperature, the connecting wire 8 will be blown to protect from the over-heated problem, in order to prevent the LED tube lamp from further danger due to inflammation. In order to achieve the above purpose, the connecting wire 8 may include a fusible portion 81, and the fusible portion 81 may use a low melting point conductive material to reach the connecting wire 8 at a certain temperature (when the melting point of the fusible portion 81 is reached), The purpose of fusing is to disconnect the connecting wire 8. The fusible portion 81 may be a low-melting alloy (such as a melting point lower than 300° C.) such as bismuth, cadmium, tin, lead, thallium, or indium, or the above-mentioned elements or a combination thereof as a main component. In addition, the low-melting-point materials of the above elements or combinations thereof can be configured to have different melting points, so the materials can be specifically selected according to actual needs.

In some embodiments, the melting point of the fusible portion 81 is less than or equal to that of any electronic component on the second circuit board 51, the second circuit board 51 itself or the electronic component used to connect the second circuit board 51 with the second circuit board 51. From another perspective, the melting point of the fusible portion 81 is less than or equal to the melting point of any conductive substance on the second circuit board 51. In order to ensure when the temperature is too high, the fusible portion 81 is first disconnected to avoid a condition in which the conductive material on the second circuit board 51 is melted and a short circuit or even a fire occurs on the second circuit board 51.

Figure 23:
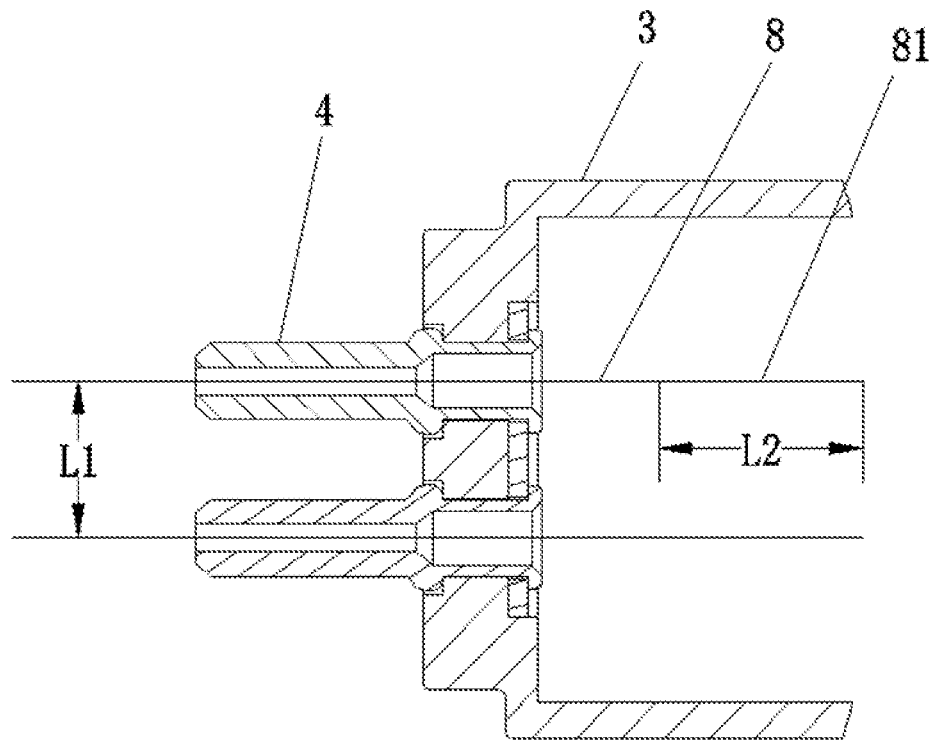
FIG. 23 illustrates a cross section diagram of partial perspective diagram of the LED tube lamp according to an embodiment of the instant disclosure.

As shown in FIG. 23, in this embodiment, the entire connecting wire 8 is composed of a fusible portion 81, that is, the entire connecting wire 8 is made of a low-melting conductive material. In some embodiments, the connecting wire 8 may only include a part of the fusible portion 81 (described in FIG. 13). When the cost of the material of the fused portion 81 is high (compared to the connecting wire 8), this method can reduce the cost. In this embodiment the melting point of the fusible portion 81 is lower than the melting point of the remaining portions of the connecting wire 8.

In some embodiments, if the second circuit board 51 and the first circuit board 2 are connected through a connecting wire 8, the connecting wire 8 is used to connect the second circuit board 51 and the first circuit board 2 may also adopt the above technical solution, that is, the connecting wire 8 includes fusible portion 81. In order to achieve the result of arc protection (over-heated protection).

Figure 27:
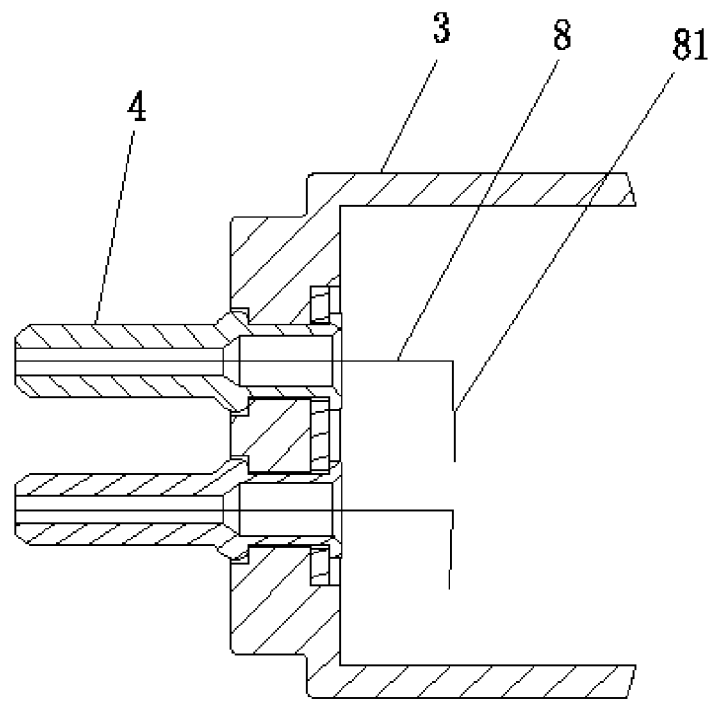
FIG. 27 illustrates a cross section diagram showing state I of the fusing part folded.
Figure 29:
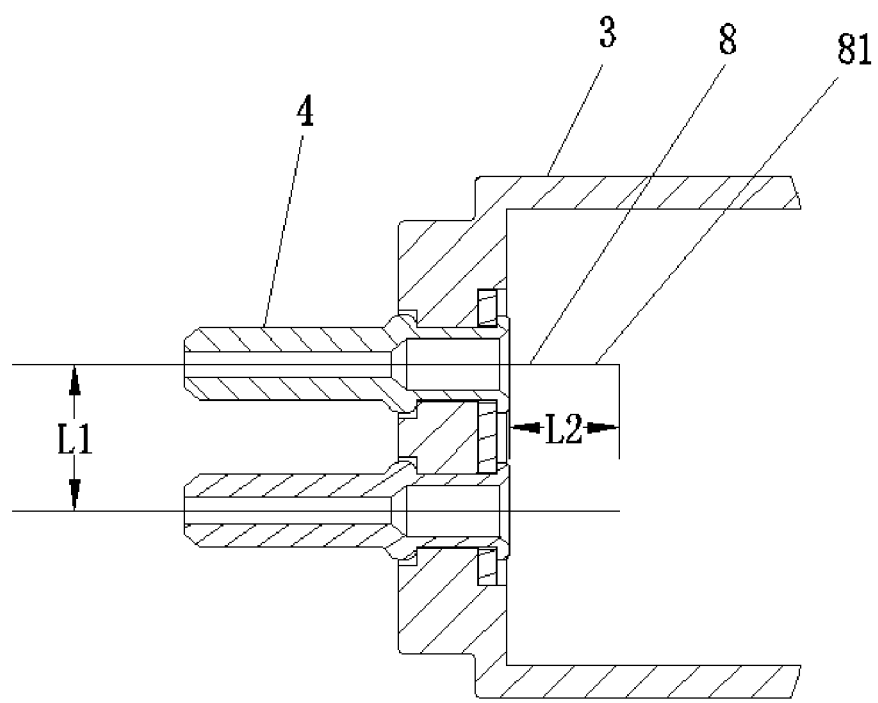
FIG. 29 illustrates a cross section diagram of partial perspective diagram of the LED tube lamp according to an embodiment of the instant disclosure.

As shown in FIG. 23, in order to prevent the fusible portion 81 of the two connecting wires 8 from being short-circuited due to contact after the fusible portion 81 is melted. The following installations can be made: the distance between the two hollow conductive pins 4 is L1, and the length L2 of the fusible portion 81 of the connecting wire 8 is set to be shorter than the distance of the two hollow conductive pins 4 is L1. Therefore, when the two hollow conductive pins 4 are set up and down, even if the fusible portion 81 is melted and one end is separated from the second circuit board 51, when the fusible portion 81 is bent due to gravity, it cannot contact the lower connecting wire 8 due to its length. As shown in FIG. 27, a schematic diagram shows the upper fusible portion 81 is bent downward. As shown in FIG. 29, if the entire connecting wire 8 is composed of a fusible portion 81, the length L2 of the fusible portion 81 is calculated as a portion of the connecting wire 8 exposed outside the hollow conductive pin 4.

Figure 28:
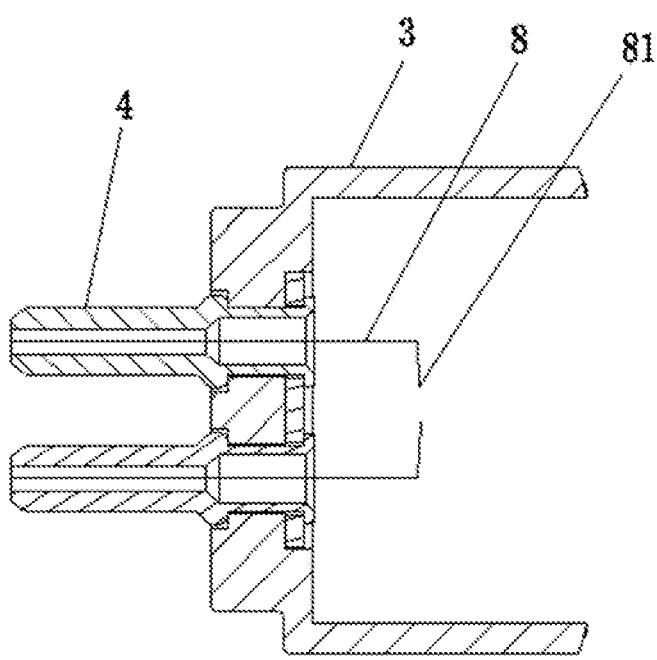
FIG. 28 illustrates a cross section diagram showing state II of the fusing part folded.

In some extreme cases, the fusible portion 81 is melted and one end is separated from the second circuit board 51. The fusible portion 81 is bent due to gravity, and the fusible portions 81 of the two connecting wires 8 are relatively bent at the same time. The length L2 of the fusible portion 81 is set to be less than half of the distance L1 of the two hollow conductive pins 4, that is, even if the two fusible portions 81 are relatively bent, a short circuit does not occur. As shown in FIG. 28, a schematic diagram shows the two fusible portions 81 are relatively bent.

Figure 26:
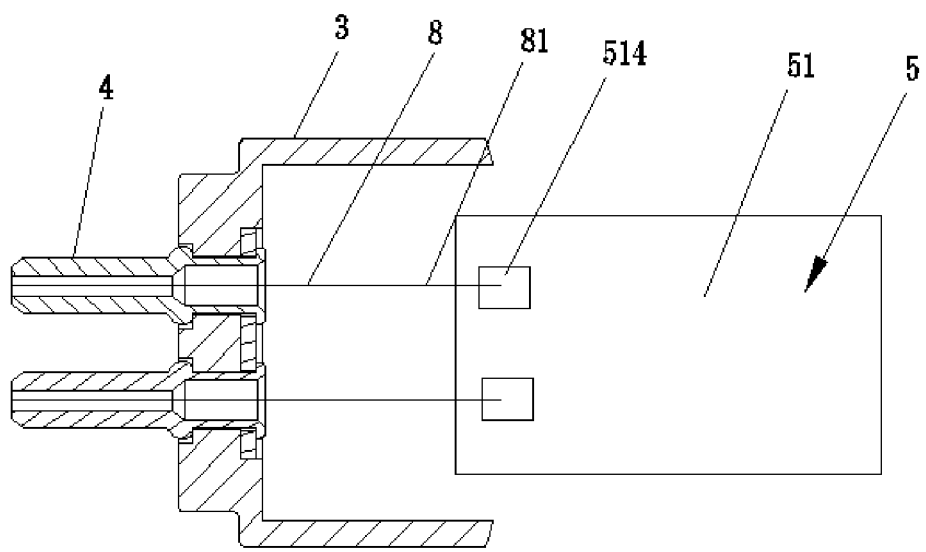
FIG. 26 illustrates a cross section diagram showing the connection of the wire and the second circuit board.

As shown in FIG. 26, the connection of the connecting wire 8 and the second circuit board 51 is shown. An adsorption portion 514 is disposed on the second circuit board 51, and one end of the fusible portion 81 of the connecting wire 8 is electrically connected to the adsorption portion 514. The adsorption portion 514 is a conductive material. After the fusible part 81 is connected to the end of the adsorption part 514 and is melted, the adsorption part 514 can adsorb and gather the material of the melted fusible part 81 to prevent the fusible part 81 from flowing to other places and cause a short circuit, and so on. When the fusible portion 81 is made of tin or mainly tin, the adsorption portion 514 is a metal material, particularly copper, and has the function of adsorbing and gathering the fusible portion

81. The melting point of the adsorption portion 514 is higher than the melting point of the fusible portion 81.

Figure 24:
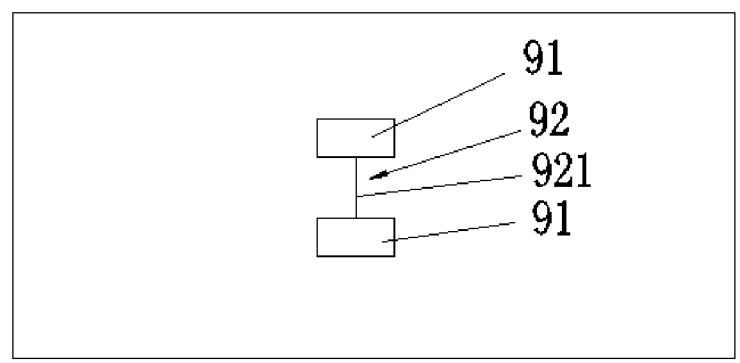
FIG. 24 illustrates a perspective diagram showing circuit board 1 according to an embodiment of the instant disclosure.

Please refer to FIG. 24, a schematic diagram of a circuit board of an LED tube lamp according to an embodiment is shown. The circuit board in this embodiment includes at least two connecting portions 91 and the two connecting portions 91 are electrically connected (electrically connected). Specifically, the connecting portions 91 are connected to each other through the connection unit 92. The connection unit 92 includes a fusible portion 921. When an arc is drawn near the connecting portion 91 or the temperature is too high, the fusible portion 921 causes the connecting portion 91 to melt. The electrical connection is then broken. The fusible portion 921 may use a low-melting conductive material (melting point is lower than 300° C.) to achieve the purpose of the connection unit 92 to fuse at the fusible portion 921 at a certain temperature, so that the connection unit 92 is disconnected and the two connecting portions 91 are disconnected. An open circuit is formed to protect it (arc protection, over-heated protection). Compared with the prior art, two wires are used to connect the two connecting portions or copper wires are used to connect the two connecting portions, and therefore improves safety. The fusible portion 921 may be a low-melting alloy (having a melting point below 300° C.) such as bismuth, cadmium, tin, lead, thallium, or indium, or the above elements or a combination thereof as a main component. And the low melting point materials of the above elements or combinations thereof have different melting points, so they can be selected according to actual needs. In this embodiment, the connection unit 92 may be composed of only the fusible portion 921. In some embodiments, the connection unit 92 includes only a part of the fusible portion 921. When the cost of the material the fusible portion 921 is high, this method can reduce the cost.

In this embodiment, the circuit board may be the second circuit board 51 or the first circuit board 2 described above, or may be another component having a connecting portion.

Figure 25:
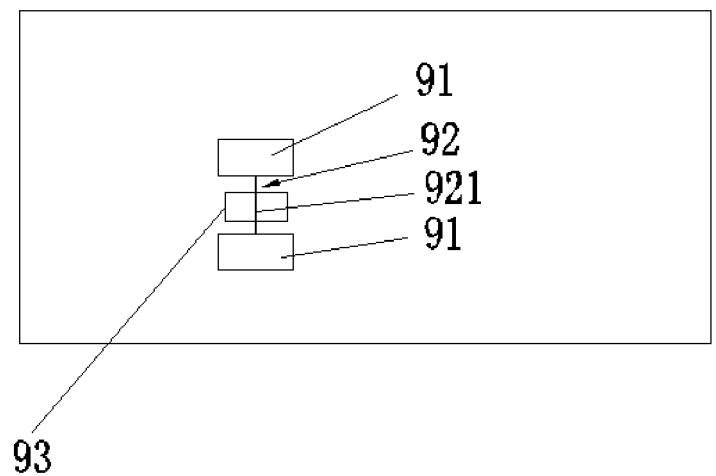
FIG. 25 illustrates a perspective diagram showing circuit board 2 according to an embodiment of the instant disclosure.

As shown in FIG. 25, in this embodiment, an absorption unit 93 may be further provided between the two connecting portions 91. The fusible portion 921 at least partially contacts the absorption unit 93. After the fusible portion 921 is melted, the absorption unit 93 adsorbs the fusible portion 921, so the materials of the melting portion 921 are melted to ensure that after the melting portion 921 is melted, the melting portion 921 is broken due to the adsorption effect of the absorption unit 93. For example, when the fusible portion 921 is made of tin or mainly tin, the absorption unit 93 is made of a material that can easily absorb tin, such as a metal material, especially copper. Alternatively, the absorbing unit 93 is made of the same material as the connecting portion 91 to achieve the function of adsorbing the material after the melting portion 921 is melted.

In this embodiment, the melting point of the fusible portion 921 is less than or equal to the melting point of any electronic component on the circuit board, the circuit board itself, or the electronic component used to connect the circuit board with the circuit board. From another perspective, the melting point of the fusible portion 921 is less than or equal to the melting point of any conductive substance on the circuit board. In order to ensure that the temperature is too high, the fusible portion 921 is first broken off to avoid a situation where a conductive material on the circuit board is melted and a short circuit or even a fire occurs on the circuit board.

Preferably, in this embodiment, the melting points of the materials of the connecting portion 91, the absorption unit 93, and the circuit board corresponding to the fusible portion 921 is higher than the fusible portion 921, so as to ensure that the connecting portion 91, the absorption unit 93, and the circuit board will not melt before the fusible portion 921 melts.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention. The disclosure of all articles and references, including patent applications and publications, is hereby incorporated by reference for all purposes. The omission of any aspect of the subject matter disclosed herein in the preceding claims is not intended to abandon the subject matter, nor should the inventor be considered to have considered the subject matter as part of the disclosed subject matter.

What is claimed is:

1. An LED tube lamp, comprising:
   a lamp tube;
   a first circuit board, disposed in the lamp tube, having a plurality of light sources mounted thereon;
   two lamp caps disposed at respective ends of the lamp tube; and
   a power supply substantially disposed in one or both of the two lamp caps, the power supply having a second circuit board, the second circuit board is electrically connected to the first circuit board;
   wherein the lamp cap includes a body and an insulating portion, the insulating portion constitutes at least a part of an end of the lamp cap, the insulating portion has an inner side surface, and a slot is set on the inner side surface, the second circuit board is inserted into the slot for fastening;
   wherein two sets of the slots are installed and the two sets of the slots are symmetrically installed on the insulating portion.

2. The LED tube lamp of claim 1, wherein the insulating portion includes a bottom wall, a first side wall, and a second side wall, and the bottom wall, the first side wall, and the second side wall form the slot, and the end of the bottom wall forms the bottom of the slot.

3. The LED tube lamp of claim 2, wherein the end of the bottom wall and the inner side surface maintain space.

4. The LED tube lamp of claim 2, wherein the first side wall has a first coupling surface, the second side wall has a second coupling surface, the first coupling surface and the second coupling surface collectively constitute side walls on both sides of the slot, the width or area of the first coupling surface is configured to be larger than the width or area of the second coupling surface.

5. The LED tube lamp of claim 2, wherein the first side wall has a first guide surface, while the second side wall has a second guide surface, the first guide surface and the second guide surface together form an opening of the slot to facilitate the second circuit board inserted into the slot through the opening.

6. The LED tube lamp of claim 2, wherein a limiting portion is set on an end portion of the second circuit board and the limiting portion matches the bottom wall to restrict the movement from the second circuit board in the width direction.

7. The LED tube lamp of claim 6, wherein the limiting portion includes a notch and the bottom wall is stuck in the notch.

8. The LED tube lamp of claim 1, wherein the ratio of the depth of the slot to the length of the second circuit board is at least 0.08.

9. The LED tube lamp of claim 1, wherein the size of the depth of the slot is between 2 and 5 mm.

10. The LED tube lamp of claim 1, wherein the ratio of the width of the slot to the thickness of the second circuit board is between 0.9:1 and 1.2:1.

11. The LED tube lamp of claim 1, wherein a hollow conductive pin is disposed on the insulating portion, the cumulative creepage distance between the hollow conductive pin and the body of the lamp cap is at least 4.5 mm.

12. The LED tube lamp of claim 1, wherein a convex portion is set on the outer edge of the insulation portion, the body forms a groove, and the convex portion is disposed in the groove.

13. The LED tube lamp of claim 1, wherein the shortest distance between the second circuit board and the inner wall of the body in the width direction of the lamp tube is greater than 3 mm.

14. The LED tube lamp of claim 1, wherein the first circuit board is a soft circuit board or a flexible circuit board, the first circuit board has a first portion fixed on the inner surface of the lamp tube and a second portion not fixed on the inner surface of the lamp tube, the second portion of the first circuit and the second circuit board are fastened by welding.

15. The LED tube lamp of claim 14, wherein the second circuit board has a first surface and a second surface, an electronic component is installed on the first surface, the distance between the first portion of the first circuit board attached to the inner surface of the lamp tube and the second surface of the second circuit board in the width direction of the lamp tube is greater than 3.5 mm.

16. The LED tube lamp of claim 15, wherein the distance between the first portion of the first circuit board attached to the inner surface of the lamp tube and the second surface of the second circuit board in the width direction of the lamp tube is less than half the diameter of the inner surface of the lamp tube.

17. The LED tube lamp of claim 15, wherein the electronic component includes a capacitor, an electrolytic capacitor, a fuse, or a transformer.

18. The LED tube lamp of claim 1, wherein the LED tube lamp is model T8 and the outer diameter of the lamp tube 1 is around 25.4 mm.

* * * * *